United States Patent
Farkas

(10) Patent No.: US 7,058,800 B2
(45) Date of Patent: Jun. 6, 2006

(54) SYSTEM FOR DEFINING INTERNAL VARIABLES BY SELECTING AND CONFIRMING THE SELECTED VALVE IS WITHIN A DEFINED RANGE OF VALUES

(75) Inventor: Rudolf Farkas, Geneva (CH)

(73) Assignee: LeCroy Corporation, Chestnut Ridge, NY (US)

( * ) Notice: Subject to any disclaimer, the term of this patent is extended or adjusted under 35 U.S.C. 154(b) by 644 days.

(21) Appl. No.: 09/988,418

(22) Filed: Nov. 16, 2001

(65) Prior Publication Data

US 2002/0105520 A1  Aug. 8, 2002

Related U.S. Application Data

(60) Provisional application No. 60/249,482, filed on Nov. 17, 2000.

(51) Int. Cl.
*G06F 1/24* (2006.01)
*G06F 9/00* (2006.01)

(52) U.S. Cl. .......................................... 713/100; 713/1
(58) Field of Classification Search .................... 713/1, 713/100; 345/440, 440.1, 440.2, 762; 702/108, 702/127; 324/500, 512; 714/25, 37, 48
See application file for complete search history.

(56) References Cited

U.S. PATENT DOCUMENTS

| | | | | |
|---|---|---|---|---|
| 4,217,651 A | * | 8/1980 | Pickering | 702/88 |
| 4,812,038 A | * | 3/1989 | Nazarathy et al. | 356/73.1 |
| 5,212,485 A | * | 5/1993 | Shank et al. | 341/161 |
| 6,100,885 A | * | 8/2000 | Donnelly et al. | 345/762 |
| 6,317,849 B1 | * | 11/2001 | Patel | 711/103 |
| 6,614,456 B1 | * | 9/2003 | Rzepkowski et al. | 345/833 |

* cited by examiner

*Primary Examiner*—Thuan Du
(74) *Attorney, Agent, or Firm*—Frommer Lawrence & Haug LLP; William S. Frommer

(57) ABSTRACT

A method and apparatus for governing the internal operation of an instrument. The apparatus comprises device for storing a value, device for changing the value and a device for attaching to another item that need to be notified of a change of the value. The value is an allowed range of values, or requested value, or an adapted value. The apparatus further comprises a device for storing attributes. The adapted value is constrained to stay within the allowed range that corresponds to physical limits. The adapted value corresponds to optimal use or to capabilities. The value may change dynamically and may depend on the state of other internal variables.

18 Claims, 11 Drawing Sheets

SYSTEM FOR DEFINING INTERNAL VARIABLES BY SELECTING AND CONFIRMING THE SELECTED VALVE IS WITHIN A DEFINED RANGE OF VALUES

CROSS-REFERENCE TO RELATED APPLICATIONS

This application claims the benefit of U.S. Provisional Application Ser. No. 60/249,482 filed Nov. 17, 2000, the entire contents thereof being incorporated herein by reference.

A computer program listing appendix is included on a compact disc submitted along with this application. The compact disc includes one program listing, titled "WaveMaster ConfigurationVBScript." The contents of the compact disc are hereby incorporated by reference.

BACKGROUND OF THE INVENTION

The present invention relates generally to a method and apparatus for processing waveform data acquired by an oscilloscope using a streaming architecture.

A Digital Oscilloscope is a complex instrument for measuring electrical signals. It is composed of many electronic hardware modules and many software modules that cooperate together in capturing, processing, displaying and storing information that characterizes the signals of interest to an operator. There are several groups of requirements that need to be addressed when creating instruments that are easy to set up and use, despite the inherent complexity of the task.

SUMMARY OF THE INVENTION

The internal variables, what can be called "control variables" are a very common and central aspect of any instrument control software. The instrument (oscilloscope or related instrument) has a "state" at any moment in time for example a certain number of components are configured and the processing components each have their state (e.g. the FFT component may have selected a certain "window", and a timing parameter a certain threshold or hysteresis). If the instrument is to ever be restored to that state, there needs be a means to store or record this overall state.

At any one time, the operator configures the instrument to perform the measuring task at hand by selecting appropriate value or setting for each of many hundred operating properties, that govern, to name only a few for example, the speed of signal capture, the number of measurement points, the sensitivity of input circuits, the type and quality of signal enhancement procedures applied in real time, the style of display of data, the parameters to be evaluated on the captured signals in real time. Each of these properties is embodied in a software entity that we name a Cvar (control variable). The set of current values of all Cvars in the instrument constitutes the control state of the instrument. You use the Cvars to control the state of the scope: the timebase, the vertical channel sensitivity, the trigger conditions, the Math and Parameter settings, the display landscapes, and tens and hundreds of other details.

Operators using the instrument need efficient means for manipulating and viewing the current values and the sets of possible values of Cvars. Manipulators include physical buttons and knobs on the instrument's front panel, virtual buttons and knobs on the instrument's screen, and Remote or Automation commands issued by computer programs that may run on separate computers connected to the instrument over a network. Operators also need efficient means for saving entire sets of Cvars in the form of computer files, for the purpose of repeating the same type of measurements at different times and/or in different places. This allows the instrument to remember the settings for the user. The user can also store, on the instrument's storage medium such as a hard disk, any number of 'setups' that the user can recall at a later date. These setup files can even be exchanged between different scope models that belong to the same instrument family, for example using the email. Each different model will try to accept the settings from a different model, and adapt them the best it can to approximate the state saved on the other instrument.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The preferred embodiments of the apparatus and method according to the present invention will be described with reference to the accompanying drawings.

In accordance with the invention, an oscilloscope design is provided that is completely "modular", whereby the elements composing the oscilloscope software are completely specified in terms of interface, and are sufficiently independent in construction that they can be installed and removed at run-time, (e.g. without stopping the process which can be considered the oscilloscope application software). This is in contrast to existing products that include software that must be wholly replaced (in it's entirety) in order to change any small attribute of the software. This inventive approach offers commercial advantage because is shortens the overall logistics of releasing new software features, fundamental to the product or fundamental to a particular application of the product. As such, a special feature can be added after a customer has taken delivery and has the instrument (oscilloscope) in operation, after the fact, without the requirement to return or for that matter even stop using the instrument. This is of value to both the customer and the manufacturer.

Further, the modular design permits "unit testing" to further advance the quality of the overall product by permitting each individual component of the software to be tested in a standard "test harness". Each component is provided with a standardized interface especially conceived to permit isolated testing. This forward looking, quality conscious aspect of the design assures final deployments of the product(s) are not hampered by the inability to localize faulty components.

Figure 1:
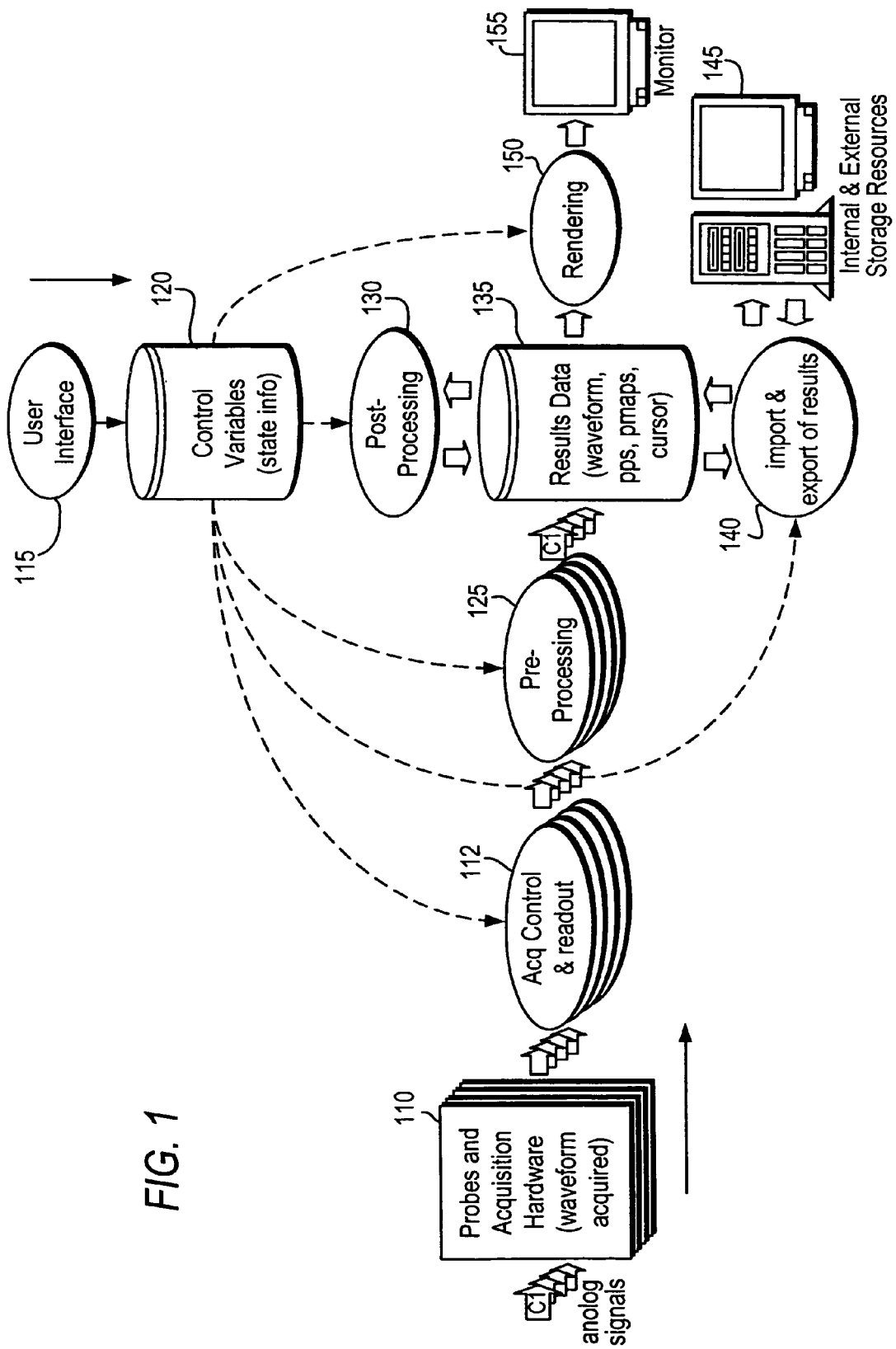
FIG. 1 is a graphical depiction of a conceptualization of the operation of an oscilloscope constructed in accordance with the invention.

FIG. 1 depicts a conceptualized notion of how the oscilloscope constructed in accordance with the invention operates. The flow of data is shown from left to right and control sequences provided by a user, either automated or manual, are shown from top down. As is shown in FIG. 1, a plurality of analog acquisition signals $C_1$ are acquired by the oscilloscope of the invention. These acquisition signals are that are in turn controlled by an acquisition control module 112 acquired in accordance with various provided probes and other acquisition hardware 110. Various acquisition control processes are applied to the acquired waveforms in accordance with various control variables 120 provided by the user via a user interface 115.

Thereafter, various results data are provided to, and thereafter output from a preprocessing system 121, and are in turn acted upon in various post processing functions 130 employing user defined control variables, resulting in processed data (Results data) 135. The post-processed data is then exported and/or imported at 140 as necessary for further processing by the system 145. After processing has been completed, the various processed data is converted for display at 150 on a display device 155.

The internal variables, what can be called "control variables" are a very common and central aspect of any instrument control software. The instrument (oscilloscope or related instrument) has a "state" at any moment in time for example a certain number of components are configured and the processing components each have their state (e.g. the FFT component may have selected a certain "window", and a timing parameter a certain threshold or hysteresis). If the instrument is to ever be restored to that state, there needs be a means to store or record this overall state.

At any one time, the operator configures the instrument to perform the measuring task at hand by selecting appropriate value or setting for each of many hundred operating properties, that govern, to name only a few for example, the speed of signal capture, the number of measurement points, the sensitivity of input circuits, the type and quality of signal enhancement procedures applied in real time, the style of display of data, the parameters to be evaluated on the captured signals in real time. Each of these properties is embodied in a software entity that we name a Cvar (control variable). The set of current values of all Cvars in the instrument constitutes the control state of the instrument. You use the Cvars to control the state of the scope: the timebase, the vertical channel sensitivity, the trigger conditions, the Math and Parameter settings, the display landscapes, and tens and hundreds of other details.

Operators using the instrument need efficient means for manipulating and viewing the current values and the sets of possible values of Cvars. Manipulators include physical buttons and knobs on the instrument's front panel, virtual buttons and knobs on the instrument's screen, and Remote or Automation commands issued by computer programs that run on separate computers connected to the instrument over a network. Operators also need efficient means for saving entire sets of Cvars in the form of computer files, for the purpose of repeating the same type of measurements at different times and/or in different places. This allows the instrument to remember the settings for the user. The user can also store any number of 'setups' that the user can recall at a later date. These setup files can even be exchanged between different scope models via email. Each different model will try to accept the settings from a different model, and adapt them the best it can to approximate the state saved on the other instrument.

At any one time, each Cvar's value must be constrained to remain within a well-defined set or range of values, appropriate and optimal for the operation of the instrument. Such constraints stem from several considerations, for example: 1. For Cvars controlling the physical state of the instrument's hardware, the constraints correspond to physical limits of that hardware and/or what is deemed by the designers of instrument as reasonable, or perhaps optimal use of that hardware; in some cases the limits must be imposed in order to prevent the physical damage to the hardware; 2. For Cvars controlling the signal processing and modes of display of data on the instrument's screen—as graphical traces, surfaces, maps and other images, and as tables of numerical values, these constraints reflect the capabilities of the mathematical software and of the graphics software and hardware built into the instrument; 3. For Cvars controlling the instrument's operation for saving and archiving data and communicating the data over computer networks, these constraints again match the capabilities of the built-in software and hardware.

Overall, such constraints serve to guide the operator in selecting the optimal settings of the instrument, and to prevent him from inadvertently selecting less useful or dangerous combinations of settings. In many cases, constraints currently applicable to any given Cvar depend on, and change with, settings of other closely related Cvars.

For example, the range of acceptable values for Vertical Offset is different for each setting (value) of Vertical Scale, and the instrument software constructed according to this invention will apply the appropriate constraints between these Cvars, whenever the operator changes these settings. This feature frees the operator from of thinking about the instrument's constraints, and lets him fully concentrate on his task of performing the measurements. A user can obtain the range of a Cvar by querying the Cvar's property Range.

Commands to change some or all Cvar values may arrive in any arbitrary order from several types of manipulators, as explained above. It is of utmost importance that the control state of the instrument, resulting from a series of such commands, should remain independent of the order in which these commands were received by the instrument's software. Software constructed according to this invention satisfies this requirement.

A Cvar is a variable inside the computer program that is embedded in the instrument and that governs the operation of the instrument's hardware and software. However, a Cvar is not a simple variable, but an instance of a class, as understood in modem computer programming languages such as C++. This lets the designers of the instrument software to confer to a Cvar a number of useful features, needed in instruments employing modern electronic hardware and computer software. Cvars have an allowed range of values, which may change dynamically, depending on states of other Cvars. Cvars have a memory of value requested by the user. They have memory of value adapted to conform to the current range of allowed values and means for attaching and detaching addresses of other software objects that need to be notified when the value, or range, or another similar property of the Cvar changes. The Cvars have memory of attributes such as "read only" or "hidden" (etc.) to affect the users interaction with it.

The Cvars have a requested value. This is the value most recently requested by the operator of the instrument. In addition to the requested value, cvars have an adapted value. This is the currently applicable value. Further, the cvars have a used value. This is the currently applied value. The used value is usually same as the adapted value, but the used value may temporary be different from the adapted value, such as when the software or hardware is busy carrying out an operation and not yet ready to apply a new Adapted Value. The Cvars also have a default value. This is the value to which the Cvar returns on command. The type of the Cvar's values may be one of but not limited to: A numeric value of type 'double' or 'real' with a physical unit, e.g. 0.125 V, A numeric value of type 'double', constrained to follow a pattern such as 1, 2, 5, 10, 20, 50, . . . , a numeric value of type 'integer', e.g. 10000 points, one value from an enumeration of several named states, e.g. "AC", a numeric value encoding a color in a graphics system, text string, e.g. a name of a computer file, a logical 2-state variable (No/Yes, Off/On), 'Action' type which embodies a request from the operator to perform some action.

The nature of the range of allowed values depends on the type of the Cvar's value. Thus, the range for a CvarDouble and CvarInt (real and integer values, respectively) is defined by the minimum and the maximum, and the grain (the smallest allowed increment, which may also be thought of as precision or resolution). The range for a CvarEnum is defined by the explicit enumeration (the list) of allowed text strings or keywords. For example, the list "AC", "DC", "GND" enumerates three possible states of a CvarEnum that controls the input coupling of one of acquisition channels.

Cvars have boolean (or logical) flags that characterize the state or the intended use of the Cvar, such as read-only (which cannot be modified by the user), hidden (temporarily or permanently hidden from the user if the Graphical interface or GUI), etc. These flags can be modified only by the instrument software via Cvar's C++ interface, normally by the owning CvarBag. They can be read via Automation property ILecCvar::Flags. State of sevaral flags can also be read with specific ILecCvar methods.

There are 12 Cvar types listed in the table below.

The 12 Cvar Types

| Type | Interface | Purpose | Note |
|---|---|---|---|
| CvarBool | ILecCvarBool | Boolean property | User toggles |
| CvarColor | ILecCvarColor | Color | |
| CvarDouble | ILecCvarDouble | Double value | |
| CvarDoubleLockstep | ILecCvarDoubleLockstep | Double value locked to discrete steps | E.g. 1, 2, 5, 10, 20, . . . |
| CvarEnum | ILecCvarEnum | List of named values | Value can be disabled, can have attachments |
| CvarImage | ILecCvarImage | Image | E.g. for previews in a dialog |
| CvarInt | ILecCvarInt | Integer value | 32 bit signed integer |
| CvarLatch | ILecCvarLatch | Boolean action property | User sets, application clears |
| CvarAction | ILecCvarAction | Boolean action property | User requests immediate action |
| CvarObject | ILecCvar | Contains an Object | IDispatch* in a Variant |
| CvarRegister | ILecCvarRegister | Image of a hardware register, up to 32-bit | Has bit manipulation methods |
| CvarString | ILecCvarString | Character string | E.g. file name |

One example of a Cvar type is CvarDouble. This Cvar provides access to a double with a range and a grain. The range (min and max) limits the adapted value. The grain has multiple meanings depending on it's sign (by convention, a positive grain is taken as an absolute value, while a negative grain is interpreted to mean the corresponding number of significant digits). Another example of a Cvar is the CvarDoubleLockstep. This Cvar provides logarithmic incrementing for a range of strictly positive values. Adapted values are locked to steps defined by the lockstep argument, for example 1, 2, 5, 10, . . . The Initialize method requires a strictly positive range (0.0<min<defaultVal<max) and one of enumerated lockstep series.

Cvars may contain Help text that may be displayed to explain to the operator of the instrument the purpose and use

Cvar Flags

| name | property | value | purpose |
|---|---|---|---|
| all | | −1 | all bits |
| none | | 0 | no bits (defaults) |
| readonly | IsReadOnly | 1 | Cvar is readonly (C++ clients can use 'force' version of SetRequestedValue to bypass) |
| hidden | IsHidden | 2 | Cvar is hidden (no widget disired in GUI) |
| wrap | | 4 | for CvarEnum only: when incremented, wraps max to min and vv. |
| lateUpdate | | 8 | Cvar will ask the Bag to SetRequestedValue() before responding to GetAdaptedValue() |
| guiOnly | IsGuiOnly | 16 | Cvar will be displayed in the GUI only, never 'exported' in vbs format for example |
| fineGrainAllowed | | 32 | for CvarLockstep only: fine grain increment allowed |
| nonvolatile | | 64 | store in Nvl script, don't store in Panel script |
| reversedDir | | 128 | Increment() decreases the value instead of increasing | of the Cvar. Cvars have an Automation Interface with methods for changing the state of the Cvar, such as set_Value, get_Value, that are available to the operator by means of 'scripts'. These are executed by controlling programs external to the instrument, and received and processed by the instrument's software.

Figure 2:
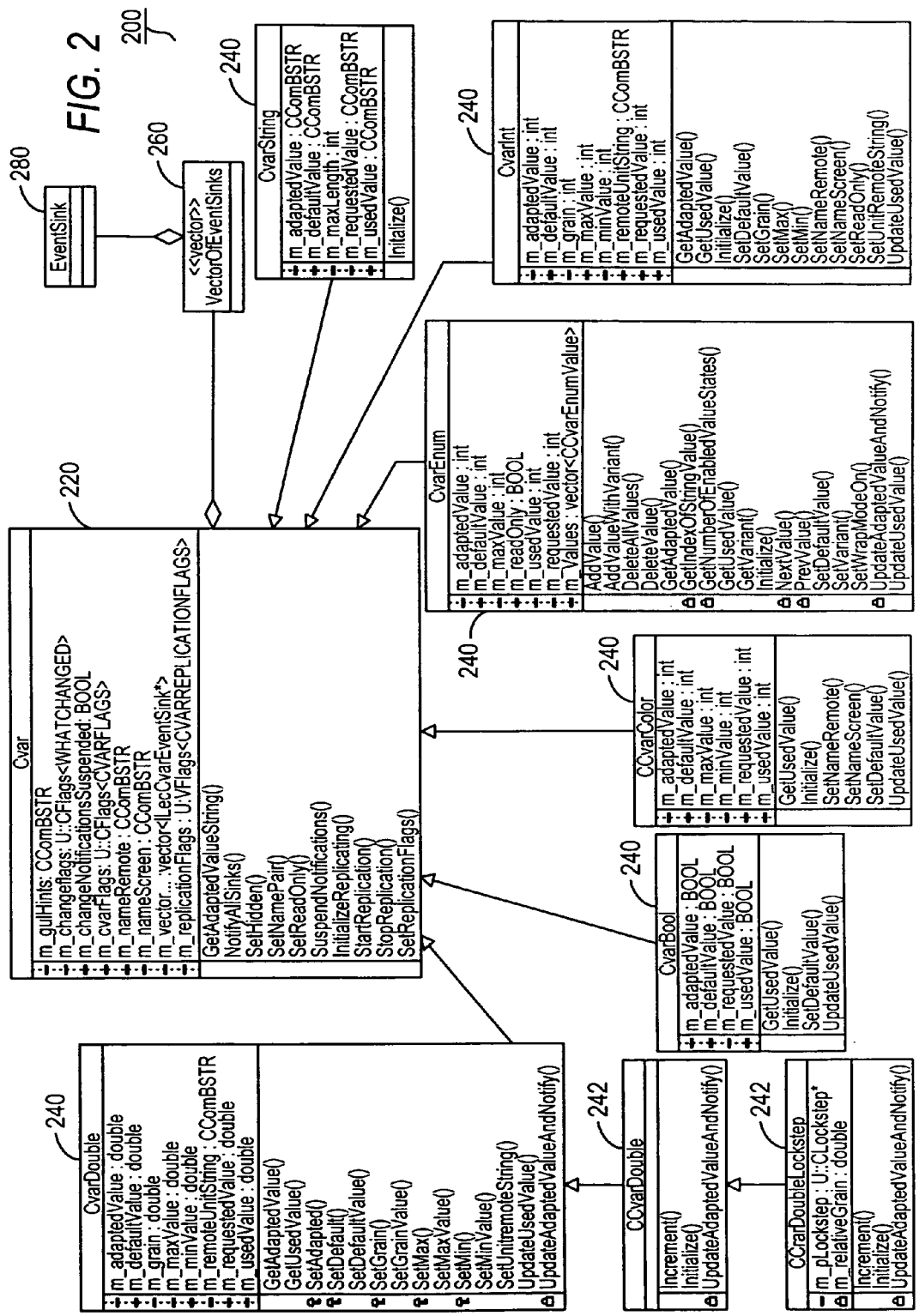
FIG. 2 graphically depicts a Cvar.

FIG. 2 graphically represents the Cvars 200. The base Cvar 220 is shown having properties and methods that have meaning to all Cvars. The type-specific Cvars 240, are shown with their properties and methods with internal attributes or member variables whose names start with m_ . . . and methods or operations. Cvar 200 is shown with a vector 260 (a list) of Event Sinks 280 or source or targets for event notifications. The type-specific Cvars 240 are sub-classes of the base class Cvar 200 and may themselves have several sub-classes 242 which implement different behaviors behind the same interface.

Cvars have an internal Interface with methods for changing the state of the Cvar, such as set_Name and for attaching or detaching the notification 'sinks', that are available only to internal software subsystems. Cvars have a name by which the Cvar is known to internal software subsystems and to the operator using the instrument. Cvars have a list of Cvar Event Sinks or 'targets' for notifications of any changes to the Cvar state. This is so that the Event Sinks can react in appropriate manner to these changes. Some possible Event Sinks are the Cvar Bag which 'owns' and coordinates a group of Cvars, the Graphical User Interface (GUI) Widgets that display the state of the Cvar to the user, and most importantly, the 'Engine' or subsystem whose operation is controlled by the Cvar.

Cvars have software connections to manipulators that let the user change the Cvar's value. Typical classes of manipulators are GUI Widgets, physical devices like pushbuttons and knobs, and Remote Commands which are discussed below. A Cvar also contains a list of Replication Sinks with addresses of dependent Cvars, which are required to replicate the state of the given Cvar. These Sinks receive notifications of selected changes in the notifying Cvar and each proceeds to update it's own state to reflect that of the notifying Cvar.

Another embodiment according to this invention is a Cvar Bag or a Collection of Cvars. The Cvar Bag has a list of contained Cvars. CvarBags are collections of Cvars belong to various subsystems and impose required constraints on Cvar's type and range of values (which may be changing dynamically). The Cvar bag initializes the contained Cvars to sensible default values at the Cvar Bag's creation time. The Cvars contained in the Cvar bag notify the owning Cvar bag of their changes of requested value, range, or attributes. The Cvar bag imposes constraints on Cvar's ranges and values, thus implementing the 'policies' that guide the operator in configuring and using the instrument. The Cvar bag has a list of Bag Event Sinks. The Bag Event Sinks are for the purpose of notifications analogous to those described for the Cvars.

Figure 3:
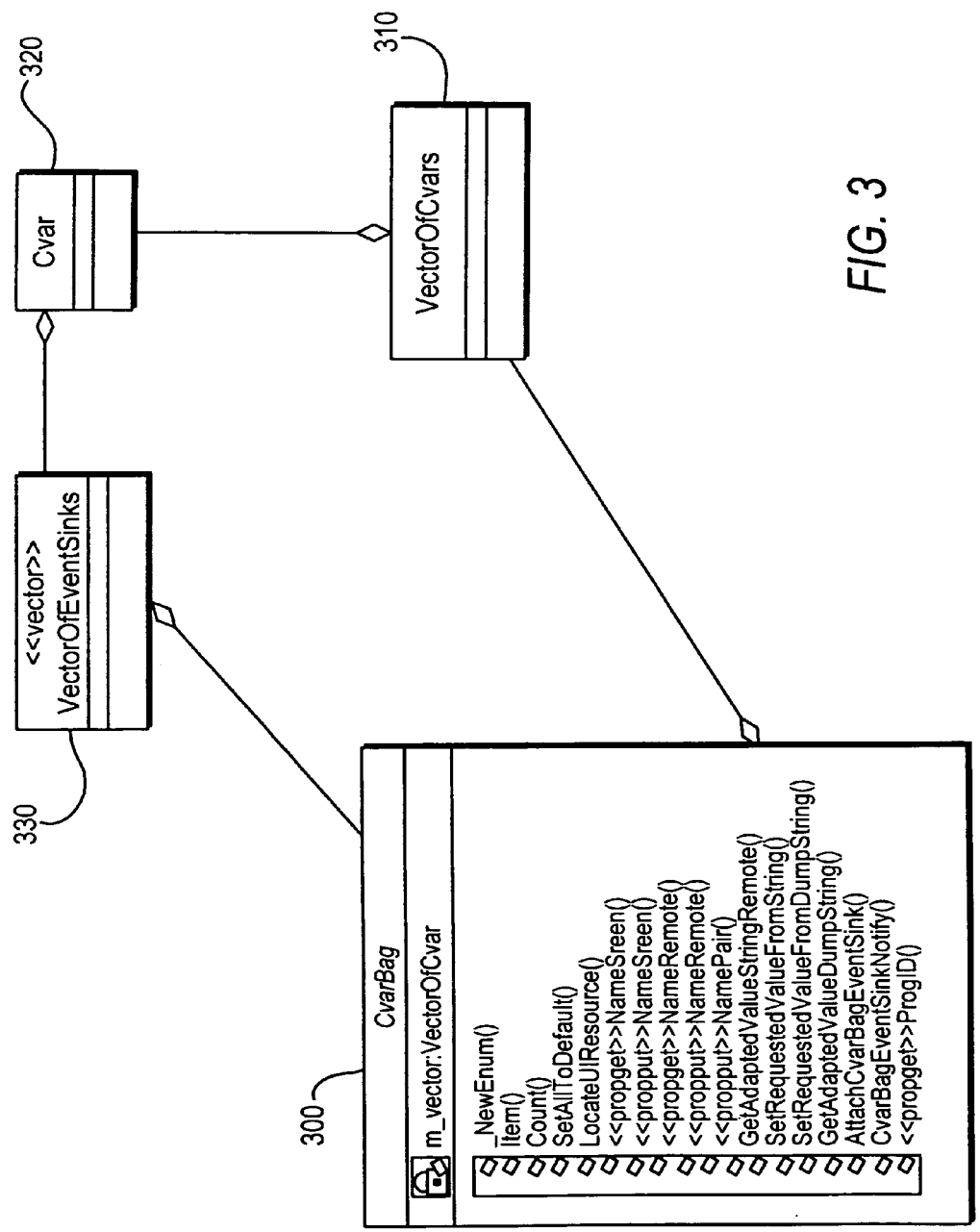
FIG. 3 graphically depicts a CvarBag.

FIG. 3 illustrates a CvarBag 300. One Cvar 320 is shown. The Cvar 320 is connected to the CvarBag 300 through a Vector 310 of Cvars and a Vector 330 of Event Sinks. Although only one Cvar 320 is shown, the presence of the vectors imply that there are many Cvars 320. This may indeed be the case. Typically there are 5 to 20 Cvars 320 in one bag.

Another embodiment according to this invention is a Widget. A Widget is a software object that is a means of displaying the state of a Cvar to the operator, or a means of manipulating the value of a Cvar, or both at the same time. A Widget is a View or Manipulator of Cvar. It displays to the user the current value of the Cvar and lets the operator modify the Cvar in some way (touchscreen, mouse interaction, keypad, etc). The typical display Widgets are software objects that control the colored lights (LEDs) on the instrument's panel or on attached probes, and or control various icons on the instrument's screen. Typical manipulator Widgets are software objects that are connected to the instrument panel knobs and buttons, to the touch screen software, or to the pointing device, e.g. mouse, software, or to software controlling the instrument's attached probes which may carry pushbuttons.

A Widget by also be in the 'both' category. These Widgets are the on-screen graphic representations of menus, dialogs, buttons, virtual keypads and keyboards, clickable tree-views and the like. By extension, a Remote control widget is the software handler object that 'understands' remote command strings sent by the operator over a computer network to the instruments. The handler translates these commands and related queries into 'set' and 'get' methods on the corresponding Cvars.

A Cvar may at any one time be connected to none, or to one or to several Widgets. Therefore, the operator may manipulate a Cvar by acting on any manipulator Widget attached. The modification of the Cvar's state is always under the direct control of the Cvar's range, which in turn is under direct control of the 'owning' Cvar Bag. The modified Cvar state will be displayed by any of the widgets attached. The modified Cvar state will typically affect the appearance of traces and data displayed on the instrument's screen.

Figure 4:
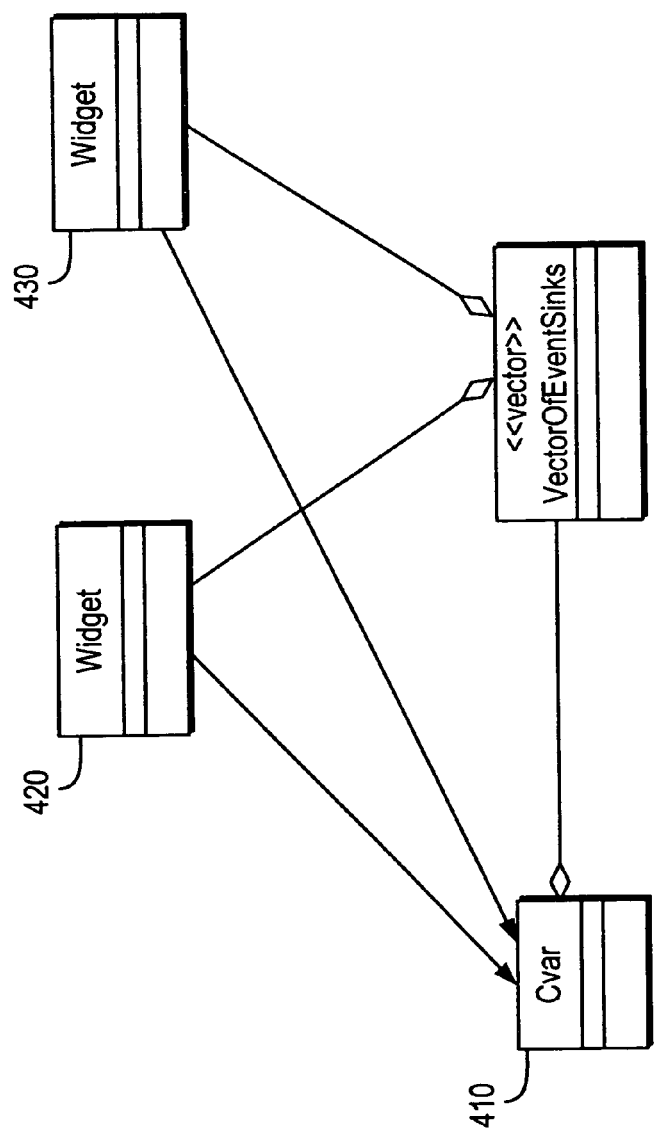
FIG. 4 graphically depicts the concept of Widgets.

FIG. 4 illustrates the concept of Widgets. A Cvar 410 is shown connected to 2 Widgets 420 and 430. In practice there are 0 to N Widgets (perhaps up to 5) and this number varies dynamically, as the user opens and closes dialogs on the screen of the instrument. Some Cvars 410 stay connected permanently, for example to a Front Panel physical knob, via the corresponding software Widget.

To create a widget, the owner of widget, typically a Dialog page, initiates a Widget and attaches a Cvar to it. The Widget turns around and subscribes to notifications of Cvar change events. A Widget is connected to one Cvar, while a Cvar can be connected to any number of Widgets. When a Cvar changes (it's value, range or flag, e.g. becomes read-only), it notifies it's subscribers of the change. Upon notification the Widget updates it's display of Cvar's value (if value changed), makes itself invisible (if Cvar became hidden), etc. When the instrument user manipulates the Widget's controls (buttons, textedit boxes, slider handles, color picker, etc), the Widget's message handler interprets the action and sends a message to the Cvar, typically an Increment( ), or SetValue( ) type message. If this in fact changes the state of Cvar (it might not, e.g. when trying to increment the Cvar when it's Adapted value is already at the end of it's range), the Cvar will send the notification to which the Widget will respond as desribed just above.

To get rid of a widget, the owner of widget detaches the Cvar by sending the Widget DetachCvar( ) message. The Widget turns around and unsubscribes from notifications of Cvar change events.

Widgets are compatible with Cvars as shown by the following table.

Widget types and corresponding Cvar types.

| Widget type | Compatible Cvar types |
| --- | --- |
| WidgetButton | CvarBool, CvarLatch, CvarAction |
| WidgetCheckbox | CvarBool, CvarInt, CvarLatch, CvarAction |
| WidgetColorPicker | CvarColor, CvarInt |
| WidgetCombobox | CvarEnum |
| WidgetComposite | CvarDouble, CvarInt |
| WidgetEditText | any Cvar |
| WidgetHSlider | CvarDouble, CvarEnum, CvarInt |
| WidgetImage | CvarImage |
| WidgetKeypad | CvarDouble, CvarInt |
| WidgetListbox | CvarEnum |
| WidgetProgEdit | CvarString |
| WidgetRadioButton | CvarEnum |
| WidgetRegister | CvarRegister |
| WidgetRichText | CvarString |
| WidgetStaticText | any Cvar |
| WidgetUpDown | CvarDouble, CvarEnum, CvarInt |

Figure 5:
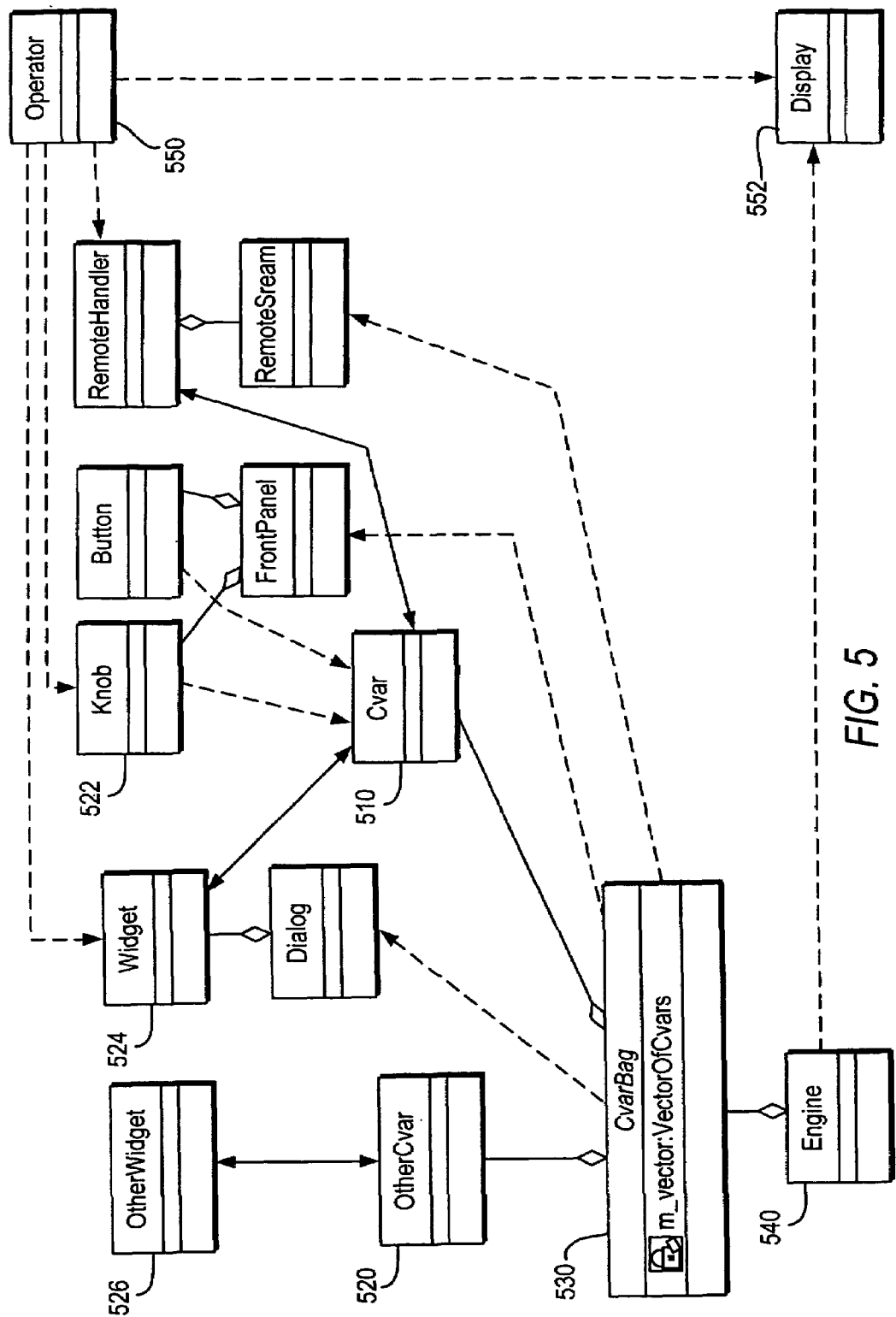
FIG. 5 shows the relationship of the Cvars and the other components.

FIG. 5 shows the relationship of the Cvars and the other components. The two Cvars 510 and 520 belonging to one CvarBag 530. The Cvar bag 530 belongs to an Engine 540 which can be a Processor, a Renderer, a Channel, e.t.c. FIG. 5 also shows the Operator 550—the person who manipulates the Cvars and observes the effect on Display 552. The Display 552 is run by the Engine 540. The Display 540 may be a display of an oscilloscope trace, whose vertical or horizontal extent, or scale, or position, or color, or any of many other attributes the operator 550 wants to modify.

Figure 6:
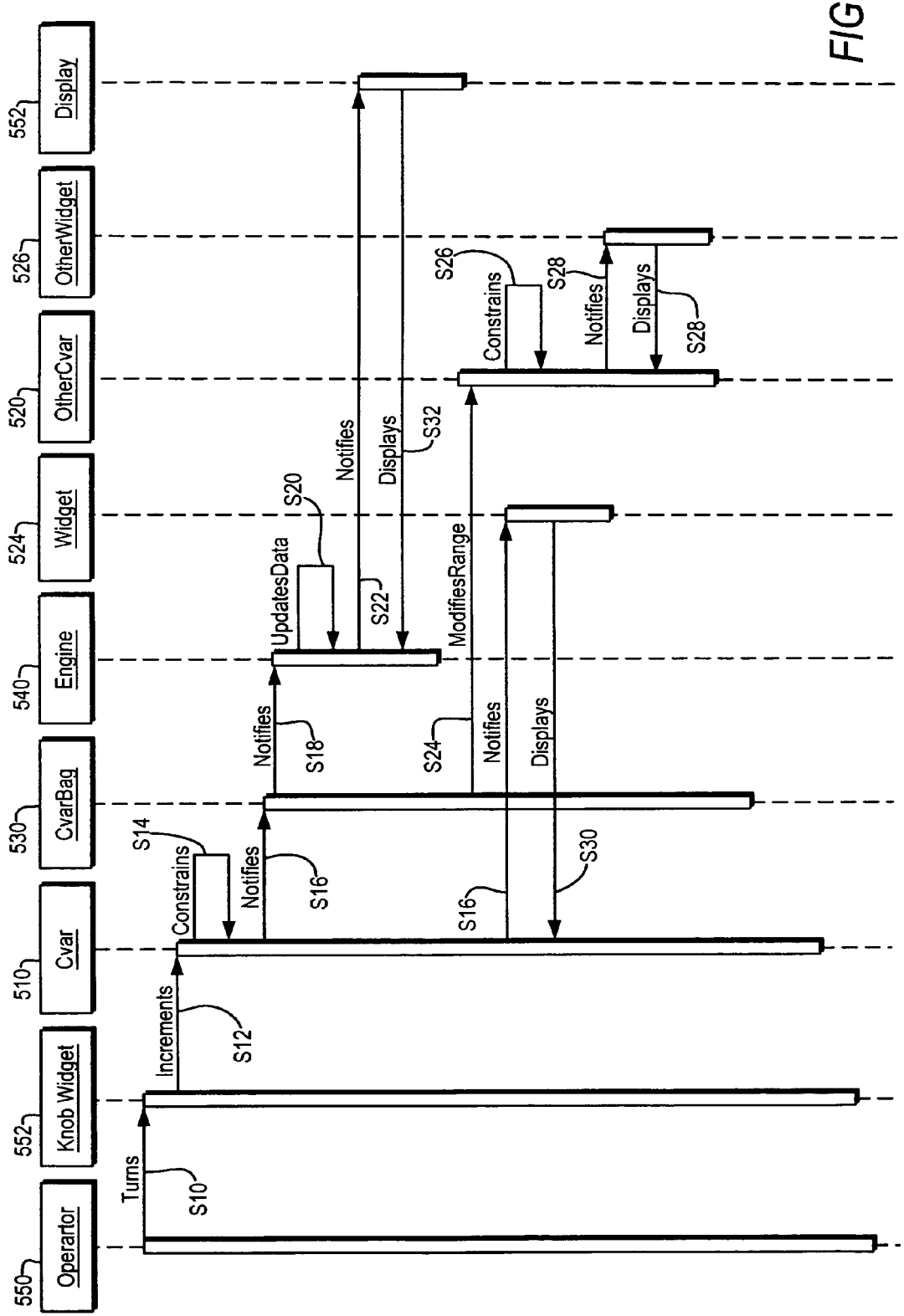
FIG. 6 shows a sequences of events that takes place when the operator changes a setting on the instrument.

FIG. 6 shows a sequences of events that takes place when the operator turns a knob on a front panel of an instrument (for example those for Vertical Scale or for Horizontal Scale) using the setup described in FIG. 5. In step S10, the operator 550 turns the knob. In step S14 the knob widget 522 increments the Cvar 510. This means that it tells the Cvar 510 to augment or reduce it's requested value by 1 increment for every 'click' of the knob—24 clicks per revolution of knob). In step S14 the Cvar 510 constrains it's adapted value to remain within the current range (that is, it will not let the requested value go beyond the current maximum, or below the current minimum). In step S16, the Cvar 510 notifies it's event sinks, which are typically the parent (owning) CvarBag 530 and one or more Widget 524 and the Engine 540, of the adapted value change. In step S18 the CvarBag 530 notifies the Engine 540 that one of it's Cvars 510 has changed In step S20 the Engine uses the newly adapted value of the Cvar 510 in subsequent processing and in step S22 notifies it's sinks such as Display 522 that it's data have been changed and may need a redisplay as in step S32. In step S24 the CvarBag 530 also uses the new value of the Cvar 510 to modify the Range of the OtherCvar 520 (that is, it's Max or it's Min). In step S26 the OtherCvar 520, seeing that it's range has changed, modifies—or not, depending on the actual values involved—it's Adapted Value, and in step S28 notifies it's sinks such as OtherWidget 526 (for example, an on-screen text area) which in step S28 displays the numeric value of OtherCvar 520. Then in step S30 Cvar 510 also notifies it's own Widget 524 which in turn redisplays the new value of Cvar 510.

Figure 7:
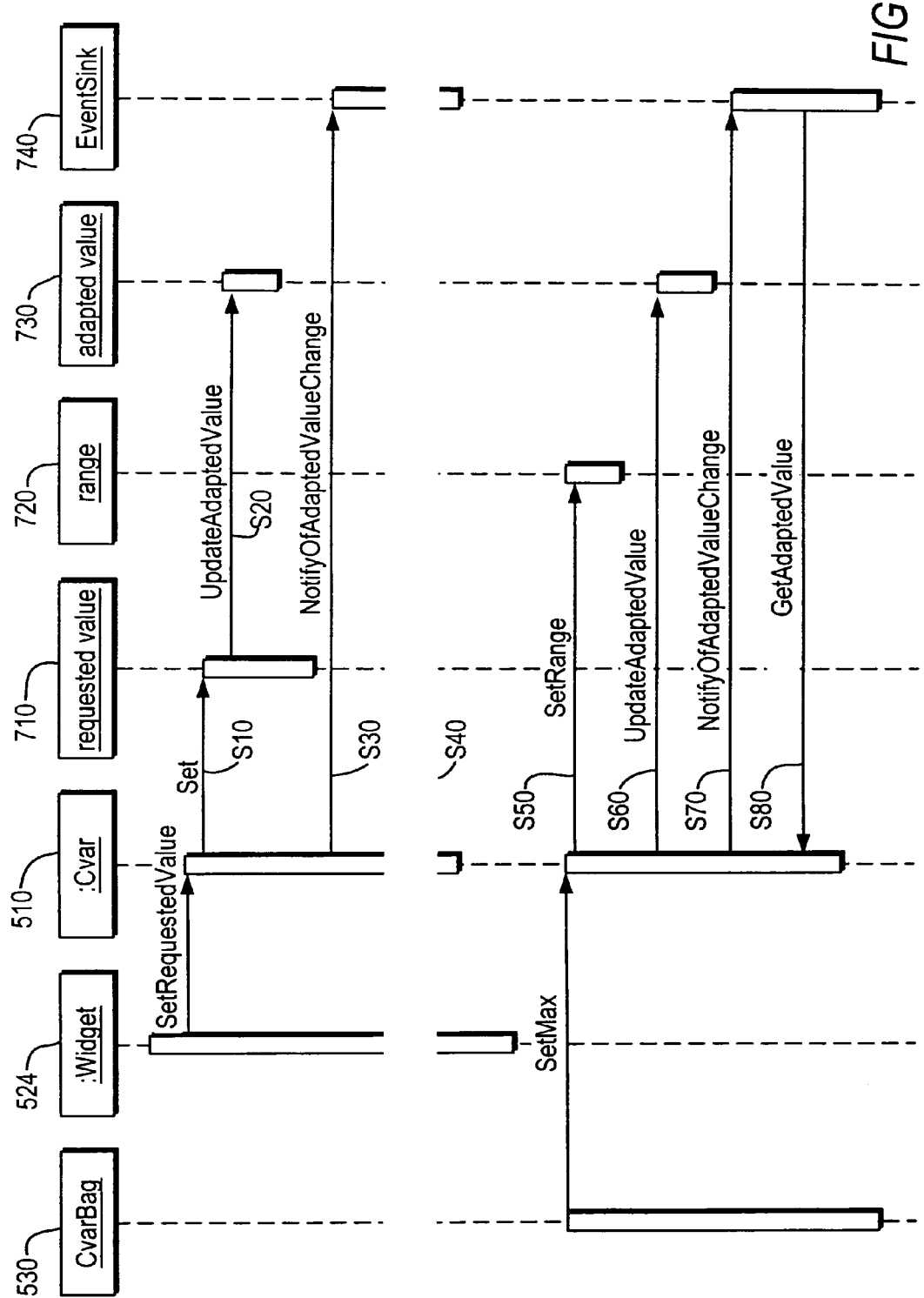
FIG. 7 depicts in more detail the inner operation of a Cvar.

FIG. 7 shows in more detail the inner operation of a Cvar, in 2 cases, the setting of a requested value to a cvar and where a CvarBag sets the maximim value of a Cvar. In the first case, where a Widget 524 sets a requested value 710 to a Cvar 510. This may be, for example, where the Widget 524 is a Front Panel numeric keypad, and the operator typed a new numerical value and pressed the Enter key. In step S10, the Cvar 510 sets it's requested value 710 property. In step S20 the Cvar 510 updates it's adapted value 730. In step S30, the Cvar 510 notifies any and all EventSinks 740 of the adapted value 730 change. In step S40 the EventSink usually turns around and gets the new adapted value 730 and uses it. Each kind of Event Sink does so in a way that is appropriate to it's function in the system. For example, a Widget may display the value, an Engine may use the value to steer it's computation, a CvarBag may change a range of another Cvar, e.t.c.

In the second case the CvarBag 530 sets the maximum value of a Cvar 510. This may be done in response to a change of another Cvar's value. In step S50 the Cvar 510 sets it's Range 720. The Maximum value is part of it's Range, most notably in the case of CvarInt and CvarDouble. In step S60 Cvar 510 updates it's adapted value 730. In step S70, Cvar 510 notifies it's EventSink 740. In step S80 the EventSink usually turns around and gets the new adapted value 730 and uses it, in various ways described with the first case.

Operators also need efficient means for saving the entire set of the instrument's Cvars, and for recalling the Cvars for later use into the same, or into another similar instrument. The oscilloscope or related instrument has a "state" at any moment in time. If the instrument is to ever be restored to that state, there needs be a means to store or record this overall state.

This can be done in the form of a computer file. This computer file is called a Panel File or a Setup File. Instruments that are capable of saving and recalling Panel Files make it possible to repeat the same type of measurements at different times and/or in different places. The advantages to users are that the user can repeat standard measurements from day to day, the user can perform rapid and reliable reconfiguration of the instrument to perform different sets of measurements. The user can also perform automated reconfiguration of instruments under the control of a computer, when the instrument is used as a part of automated testing equipment on production floor and the user can enforce uniform measurement standards in laboratory or on the production floor, both within one industrial plant and world-wide across many plants.

Improved models of instruments are constantly being developed and they progressively replace older models in the hands of operators. It is necessary to design the Panel-related instrument software in a way that makes it possible to recall Panel Files from older models into newer models. The advantages to users are that they preserve the investment that went into creation of their standard measurement procedures (manual or automated), as partially embodied in the instrument's Panel files. The present invention aims at solving problems related to saving, restoring and transmitting electronically the instrument control states embodied in Panel files.

The collective state of many Cvars can be recorded as visual basic script. This is because the control variable objects have been endowed with what is called an "automation interface" (discussed above). As a consequence, when the state of the application is recorded (or saved) it is saved in the form of a basic scripting program. This will be true for any application constructed in this architecture, by virtue mostly of the control variable design. As such, within the context of Microsoft Windows operating system in order to start the instrument software in a given "state" the basic script must be launched. Therefore, the instrument can be completely controlled and/or restored by this same scripting mechanism.

The saved Panel files may be recalled from files on the disk into the instrument, with the effect of restoring the instrument state to what it was at the time when the Panel file was saved. The instrument state may be saved to a Panel file named by the user, when the user decides to do so. The instrument state may also may be automatically saved at preset time intervals, or and when the instrument is turned off. The instrument state. that was automatically saved when the instrument was turned off will be automatically restored when the instrument is turned on the next time.

The Panel files are modular down to the level of individual Cvar. The individual Cvar is designated in the Panel file by a hierarchical 'path' or 'address', illustrated by these two examples: "appA.subB.partC1.cvarX1", "appA.subB.partC2.cvarX1". Their meaning is: First, we are addressing the Cvar named "cvarX1", located in the "part C1" of the subsystem "subB" of the application. "appA". Second, we are addressing another Cvar also named "cvarX1", but located in the "part C2" of the same subsystem of the same application. The preferred format of the Panel file is human readable text, with one line for each Cvar. However, this does not exclude alternate formats, such as binary, or encrypted, or compressed, provided that the modularity down to the level of individual Cvar is preserved.

The Panel file text constitutes preferably a computer program in an industry standard programming language. This is exemplified but not limited to Visual Basic Script (VBS). However, this does not exclude alternate text formats that constitute a computer program in a proprietary language. Instruments supporting the Panel files contain software methods or routines that upon command automatically generate or write the appropriate Panel file sections. These methods are located in all levels of the hierarchy of subsystems, so that the hierarchical addresses automatically reflect the hierarchy of subsystems.

The instruments supporting the Panel files contain software methods or routines for reading or recalling or loading the Panel Files. These methods are located in all levels of the hierarchy of subsystems, so each subsystem can recognize Cvar items that belong to it according to it's partial address. Therefore, it can route the information towards the target Cvar, while ignoring the Cvars located on other branches of the hierarchy tree.

Panel Files that are also programs in a known scripting language can be used by operators as models for more elaborate programs for automated control of instruments. The order in which the individual Cvars belonging to a given Cvar Bag appear in the Panel File can be changed at will, without affecting the resulting instrument control state. This is the consequence of the fact that each Cvar stores the Requested value and reevaluates the Adapted value whenever it's constraints change. This allows testing procedures to be automated, and test or monitoring to be performed unattended. This also allows permitted values to be found.

Once the basic scripting is performed, the range of permitted settings can be queried by basic scripting. Then, the requested value is cached and can be queried. This permits late resolution of inter-variable constraints.

Figure 8:
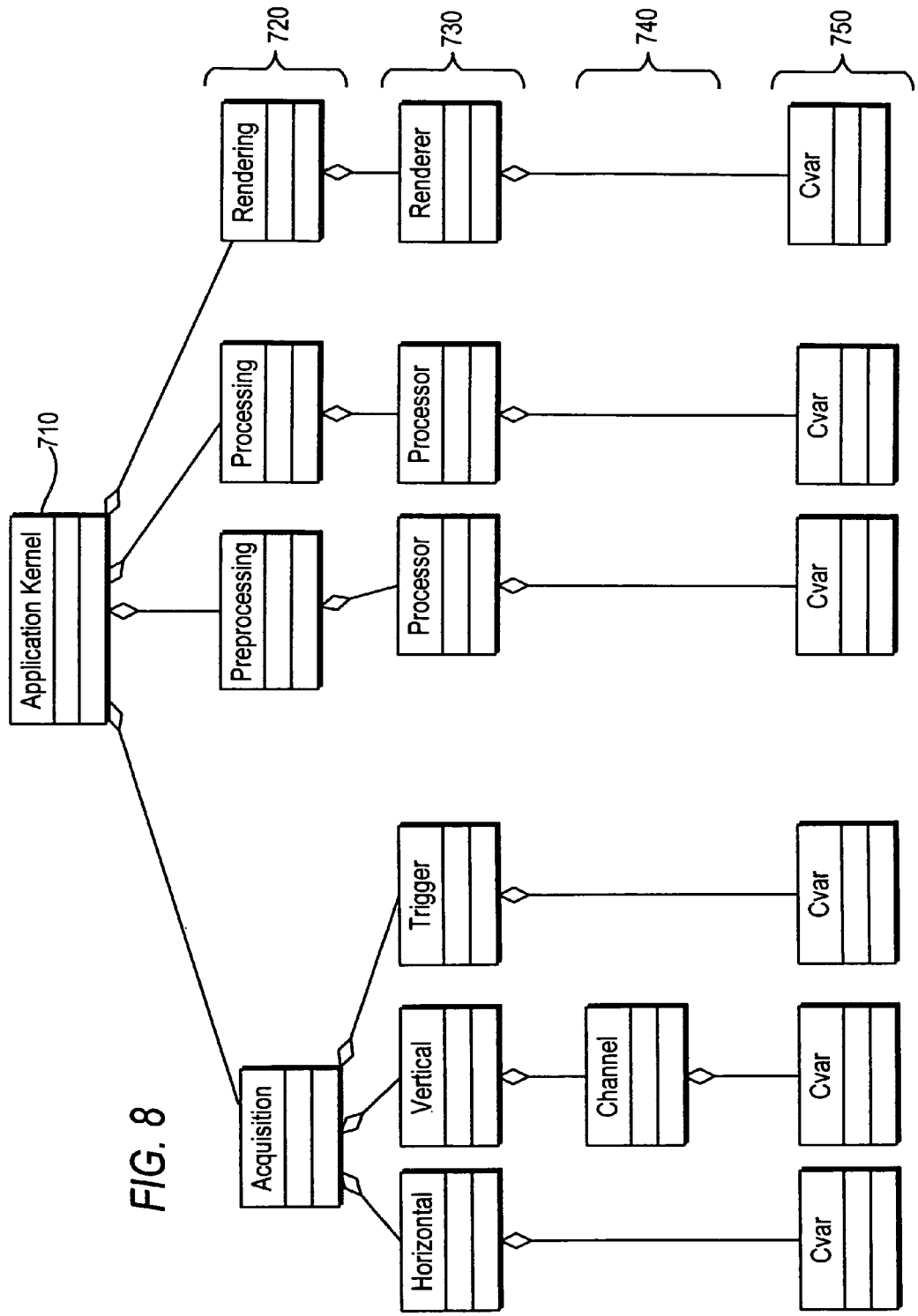
FIG. 8 depicts the initialization of Cvars, panel capture and retrieval.

FIG. 8 shows the initialization of Cvars, panel capture and retrieval. The figure shows a hierarchy of high level objects representative of the software. There are many more of them in the real case. An actual real and complete diagram would be both much wider, and deeper (or taller), in number of hierarchy levels, but this figure is used to illustrate the principle. This figure can be compared to FIG. 1. FIG. 8 shows a number of software objects 720, 730 and 740 at different levels. All the software objects 720, 730 and 740 'own' Cvars 750. Consequently, the construction and initialization of Cvars 750 proceeds in hierarchical fashion, starting at the top. The ApplicationKernel 710 here (although in practice there could be additional layers above it) and each software object 720 constructs and initializes the child objects 730, which in turn construct and initialize their own child objects 740, until the individual Cvars 750 are constructed and initialized.

Figure 9:
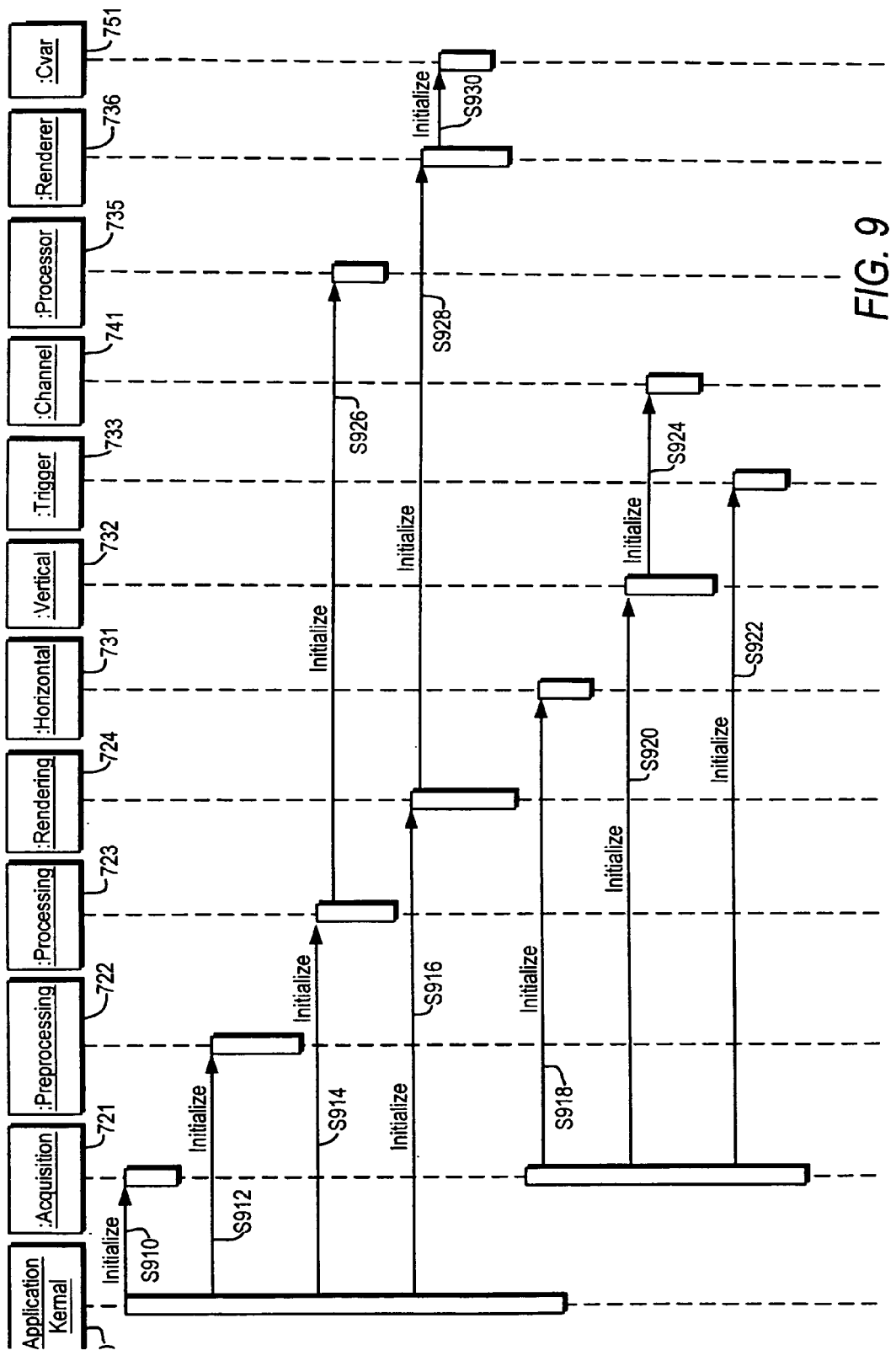
FIG. 9 is a flow chart showing the initialization of Cvars.

FIG. 9 is a flow chart showing the initialization of Cvars. The flow for capturing the panel file and reloading the panel file is similar, following the same hierarchical paths. In step S910 the ApplicationKernel constructs and initializes the Acquisition object 721. In step S912 the ApplicationKernel constructs and initializes the Preprocessing object 722. In step S914 the ApplicationKernel constructs and initializes the Processing object 721. In step S916 the ApplicationKernel constructs and initializes the Rendering object 724. In step S918 the Acquisition object 721 constructs and initializes the Horizontal object 731. In step S920 the Acquisition object 721 constructs and initializes the Vertical object 732. In step S922 the Acquisition object 721 constructs and initializes the Trigger object 733. In step S924 the vertical object 732 constructs and initializes the channel object 741. In step S926, the Processing object 723 constructs and initializes the processor object 735. In step S928, the Rendering object constructs and initializes the renderer object 736. In step S930, the Renderer object constructs and initializes Cvar 751.

Set forth on an accompanying compact disc in accordance with 37 CFR 1.96(c) is the computer program listing appendix, including a Visual Basic script of a Panel file. The hierarchical structure is visible in the 'composite path strings' found in that file such as these:

Set Acquisition=WaveMaster.Acquisition
Set C1=Acquisition.C1
C1 .VerScale=0.05
C1 .VerOffset=0
C1 .Coupling="DC50"
C1 .BandwidthLimit="2 MHz"
C1 .ProbeAttenuation=1

In above examples, the main software object, WaveMaster, owns Acquisition which owns channel C1 which owns Cvars such as VerScale which is being set to the requested value of 0.05 volts.

C1.BandwidthLimit = "2MHz"

C1.ProbeAttenuation = 1

In above examples, the main software object, WaveMaster, owns Acquisition which owns channel C1 which owns Cvars such as VerScale which is being set to the requested value of 0.05 volts.

```
' WaveMaster ConfigurationVBScript ...

On Error Resume Next
set WaveMaster = CreateObject("LeCroy.AladdinApplication")

WaveMaster.Enable = false

' AladdinPersona ...
WaveMaster.InstrumentModel = "AladdinApp"
WaveMaster.InstrumentID = "LECROY,MAUI,Aladdin-001,0.001"
WaveMaster.ProductRoot = "c:\LeCroy\Maui\Aladdin"
WaveMaster.HideClock = False Set Acquisition = WaveMaster.Acquisition
' Acquisition ...

Set C1 = Acquisition.C1
' C1 ...
C1.View = True
C1.UseGrid = "YT1"
C1.UseDotJoin = True
C1.Persisted = False
C1.PersistenceSaturation = 50
C1.PersistenceMonoChrome = False
C1.VerScale = 0.05
C1.VerScaleVariable = False
C1.VerOffset = 0
C1.Coupling = "DC50"
C1.BandwidthLimit = "2MHz"
C1.AverageSweeps = 1
C1.EnhanceResType = "None"
C1.InterpolateType = "Linear"
C1.Invert = False
C1.ProbeAttenuation = 1

Set C2 = Acquisition.C2
' C2 ...
C2.View = True
C2.UseGrid = "YT1"
C2.UseDotJoin = True
C2.Persisted = False
C2.PersistenceSaturation = 50
```

```
C2.PersistenceMonoChrome = False
C2.VerScale = 0.05
C2.VerScaleVariable = False
C2.VerOffset = 0
C2.Coupling = "DC50"
C2.BandwidthLimit = "2MHz"
C2.AverageSweeps = 1
C2.EnhanceResType = "None"
C2.InterpolateType = "Linear"
C2.Invert = False
C2.ProbeAttenuation = 1

Set C3 = Acquisition.C3
' C3 ...
C3.View = False
C3.UseGrid = "YT1"
C3.UseDotJoin = True
C3.Persisted = False
C3.PersistenceSaturation = 50
C3.PersistenceMonoChrome = False
C3.VerScale = 0.05
C3.VerScaleVariable = False
C3.VerOffset = 0
C3.Coupling = "DC50"
C3.BandwidthLimit = "2MHz"
C3.AverageSweeps = 1
C3.EnhanceResType = "None"
C3.InterpolateType = "Linear"
C3.Invert = False
C3.ProbeAttenuation = 1

Set C4 = Acquisition.C4
' C4 ...
C4.View = False
C4.UseGrid = "YT1"
C4.UseDotJoin = True
C4.Persisted = False
C4.PersistenceSaturation = 50
C4.PersistenceMonoChrome = False
C4.VerScale = 0.05
C4.VerScaleVariable = False
C4.VerOffset = 0
C4.Coupling = "DC50"
C4.BandwidthLimit = "2MHz"
C4.AverageSweeps = 1
C4.EnhanceResType = "None"
C4.InterpolateType = "Linear"
C4.Invert = False
C4.ProbeAttenuation = 1

Set Horizontal = Acquisition.Horizontal
' Horizontal ...
Horizontal.HorScale = 0.00000005
Horizontal.HorOffset = 0
Horizontal.HorOffsetOrigin = 5
Horizontal.NumPoints = 5000
Horizontal.TimePerPoint = 0.0000000001
```

```
Horizontal.SampleMode = "RealTime"
Horizontal.NumSegments = 1
Horizontal.SequenceTimeout = 0.01
Horizontal.SequenceTimeoutEnable = True
Horizontal.ActiveChannels = "10GS/s"
Horizontal.SampleClock = "Internal"
Horizontal.ExternalClockRate = 1
Horizontal.ReferenceClock = "Internal"
Horizontal.SamplingRate = 10000000000
Horizontal.ForNanoSecToKSec = 0.0000005
Horizontal.MaxSamples = 100000

Set Trigger = Acquisition.Trigger
' Trigger ...
Trigger.Source = "C1"
Trigger.Type = "Edge"
Trigger.ValidateSource = "C1"
Trigger.HoldoffType = "Off"
Trigger.HoldoffTime = 0.000000002
Trigger.HoldoffEvents = 1
Trigger.DropoutTime = 0.000000002
Trigger.Glitch = "LessThan"
Trigger.GlitchLow = 0.0000000006
Trigger.GlitchHigh = 0.0000000006
Trigger.Width = "LessThan"
Trigger.WidthRange = "Tolerance"
Trigger.WidthNominal = 0.0000000006
Trigger.WidthDelta = 0.0000000006
Trigger.Interval = "LessThan"
Trigger.IntervalLow = 0.000000002
Trigger.IntervalHigh = 0.000000002
Trigger.IntervalRange = "Tolerance"
Trigger.IntervalNominal = 0.0000000006
Trigger.IntervalDelta = 0.0000000006
Trigger.QualState = "Below"
Trigger.QualWait = "<"
Trigger.QualTime = 0.000000002
Trigger.QualEvents = 1
Trigger.PatternType = "Nand"
Trigger.TrigSlope = "Negative"
Trigger.TrigCoupling = "DC"
Trigger.TrigLevel = 0.05

Set Math = WaveMaster.Math
' Math ...
Math.MultiZoomF1 = "Off"
Math.MultiZoomF2 = "Off"
Math.MultiZoomF3 = "Off"
Math.MultiZoomF4 = "Off"
Math.MultiZoomF5 = "Off"
Math.MultiZoomF6 = "Off"
Math.MultiZoomF7 = "Off"
Math.MultiZoomF8 = "Off"
Math.AutoScrollOn = False
Math.MultiZoomOn = False Set F1 = Math.F1
```

```
' F1 ...
F1.View = False
F1.UseGrid = "YT1"
F1.UseDotJoin = True
F1.Persisted = False
F1.PersistenceSaturation = 50
F1.PersistenceMonoChrome = False
F1.EZoff = False
F1.EZFunction1 = "wident"
F1.Function2 = "undef"
F1.EZSource1 = "C1"

Set F1Operator1 = F1.Operator1
' Operator1 ...
F1Operator1.Enable = True
F1Operator1.Origin = ""
F1Operator1.Visible = True
F1Operator1.XPos = 0
F1Operator1.YPos = 0
F1Operator1.UsageCount = 0

Set F1Operator2 = F1.Operator2
' Operator2 ...

Set F1Zoom = F1.Zoom
' Zoom ...
F1Zoom.Enable = True
F1Zoom.Origin = ""
F1Zoom.Visible = True
F1Zoom.XPos = 0
F1Zoom.YPos = 0
F1Zoom.UsageCount = 0
F1Zoom.VerPos = 0.5
F1Zoom.VerZoom = 1
F1Zoom.HorPos = 0.5
F1Zoom.HorZoom = 1
F1Zoom.MinVisiblePoints = 5
F1Zoom.VerStart = 0
F1Zoom.VerStop = 0
F1Zoom.HorStart = 0
F1Zoom.HorStop = 0
F1Zoom.VariableVerZoom = False
F1Zoom.VariableHorZoom = False Set F2 = Math.F2
' F2 ...
F2.View = False
F2.UseGrid = "YT1"
F2.UseDotJoin = True
F2.Persisted = False
F2.PersistenceSaturation = 50
F2.PersistenceMonoChrome = False
F2.EZoff = False
F2.EZFunction1 = "wident"
F2.Function2 = "undef"
F2.EZSource1 = "C1"
```

```
Set F2Operator1 = F2.Operator1
' Operator1 ...
F2Operator1.Enable = True
F2Operator1.Origin = ""
F2Operator1.Visible = True
F2Operator1.XPos = 0
F2Operator1.YPos = 0
F2Operator1.UsageCount = 0

Set F2Operator2 = F2.Operator2
' Operator2 ...

Set F2Zoom = F2.Zoom
' Zoom ...
F2Zoom.Enable = True
F2Zoom.Origin = ""
F2Zoom.Visible = True
F2Zoom.XPos = 0
F2Zoom.YPos = 0
F2Zoom.UsageCount = 0
F2Zoom.VerPos = 0.5
F2Zoom.VerZoom = 1
F2Zoom.HorPos = 0.5
F2Zoom.HorZoom = 1
F2Zoom.MinVisiblePoints = 5
F2Zoom.VerStart = 0
F2Zoom.VerStop = 0
F2Zoom.HorStart = 0
F2Zoom.HorStop = 0
F2Zoom.VariableVerZoom = False
F2Zoom.VariableHorZoom = False Set F3 = Math.F3
' F3 ...
F3.View = False
F3.UseGrid = "YT1"
F3.UseDotJoin = True
F3.Persisted = False
F3.PersistenceSaturation = 50
F3.PersistenceMonoChrome = False
F3.EZoff = False
F3.EZFunction1 = "wident"
F3.Function2 = "undef"
F3.EZSource1 = "C1"

Set F3Operator1 = F3.Operator1
' Operator1 ...
F3Operator1.Enable = True
F3Operator1.Origin = ""
F3Operator1.Visible = True
F3Operator1.XPos = 0
F3Operator1.YPos = 0
F3Operator1.UsageCount = 0

Set F3Operator2 = F3.Operator2
' Operator2 ...
```

```
Set F3Zoom = F3.Zoom
' Zoom ...
F3Zoom.Enable = True
F3Zoom.Origin = ""
F3Zoom.Visible = True
F3Zoom.XPos = 0
F3Zoom.YPos = 0
F3Zoom.UsageCount = 0
F3Zoom.VerPos = 0.5
F3Zoom.VerZoom = 1
F3Zoom.HorPos = 0.5
F3Zoom.HorZoom = 1
F3Zoom.MinVisiblePoints = 5
F3Zoom.VerStart = 0
F3Zoom.VerStop = 0
F3Zoom.HorStart = 0
F3Zoom.HorStop = 0
F3Zoom.VariableVerZoom = False
F3Zoom.VariableHorZoom = False Set F4 = Math.F4
' F4 ...
F4.View = False
F4.UseGrid = "YT1"
F4.UseDotJoin = True
F4.Persisted = False
F4.PersistenceSaturation = 50
F4.PersistenceMonoChrome = False
F4.EZoff = False
F4.EZFunction1 = "wident"
F4.Function2 = "undef"
F4.EZSource1 = "C1"

Set F4Operator1 = F4.Operator1
' Operator1 ...
F4Operator1.Enable = True
F4Operator1.Origin = ""
F4Operator1.Visible = True
F4Operator1.XPos = 0
F4Operator1.YPos = 0
F4Operator1.UsageCount = 0

Set F4Operator2 = F4.Operator2
' Operator2 ...

Set F4Zoom = F4.Zoom
' Zoom ...
F4Zoom.Enable = True
F4Zoom.Origin = ""
F4Zoom.Visible = True
F4Zoom.XPos = 0
F4Zoom.YPos = 0
F4Zoom.UsageCount = 0
F4Zoom.VerPos = 0.5
F4Zoom.VerZoom = 1
F4Zoom.HorPos = 0.5
F4Zoom.HorZoom = 1
```

```
F4Zoom.MinVisiblePoints = 5
F4Zoom.VerStart = 0
F4Zoom.VerStop = 0
F4Zoom.HorStart = 0
F4Zoom.HorStop = 0
F4Zoom.VariableVerZoom = False
F4Zoom.VariableHorZoom = False Set F5 = Math.F5
' F5 ...
F5.View = False
F5.UseGrid = "YT1"
F5.UseDotJoin = True
F5.Persisted = False
F5.PersistenceSaturation = 50
F5.PersistenceMonoChrome = False
F5.EZoff = False
F5.EZFunction1 = "wident"
F5.Function2 = "undef"
F5.EZSource1 = "C1"

Set F5Operator1 = F5.Operator1
' Operator1 ...
F5Operator1.Enable = True
F5Operator1.Origin = ""
F5Operator1.Visible = True
F5Operator1.XPos = 0
F5Operator1.YPos = 0
F5Operator1.UsageCount = 0

Set F5Operator2 = F5.Operator2
' Operator2 ...

Set F5Zoom = F5.Zoom
' Zoom ...
F5Zoom.Enable = True
F5Zoom.Origin = ""
F5Zoom.Visible = True
F5Zoom.XPos = 0
F5Zoom.YPos = 0
F5Zoom.UsageCount = 0
F5Zoom.VerPos = 0.5
F5Zoom.VerZoom = 1
F5Zoom.HorPos = 0.5
F5Zoom.HorZoom = 1
F5Zoom.MinVisiblePoints = 5
F5Zoom.VerStart = 0
F5Zoom.VerStop = 0
F5Zoom.HorStart = 0
F5Zoom.HorStop = 0
F5Zoom.VariableVerZoom = False
F5Zoom.VariableHorZoom = False Set F6 = Math.F6
' F6 ...
F6.View = False
F6.UseGrid = "YT1"
```

```
F6.UseDotJoin = True
F6.Persisted = False
F6.PersistenceSaturation = 50
F6.PersistenceMonoChrome = False
F6.EZoff = False
F6.EZFunction1 = "widen1"
F6.Function2 = "undef"
F6.EZSource1 = "C1"

Set F6Operator1 = F6.Operator1
' Operator1 ...
F6Operator1.Enable = True
F6Operator1.Origin = ""
F6Operator1.Visible = True
F6Operator1.XPos = 0
F6Operator1.YPos = 0
F6Operator1.UsageCount = 0

Set F6Operator2 = F6.Operator2
' Operator2 ...

Set F6Zoom = F6.Zoom
' Zoom ...
F6Zoom.Enable = True
F6Zoom.Origin = ""
F6Zoom.Visible = True
F6Zoom.XPos = 0
F6Zoom.YPos = 0
F6Zoom.UsageCount = 0
F6Zoom.VerPos = 0.5
F6Zoom.VerZoom = 1
F6Zoom.HorPos = 0.5
F6Zoom.HorZoom = 1
F6Zoom.MinVisiblePoints = 5
F6Zoom.VerStart = 0
F6Zoom.VerStop = 0
F6Zoom.HorStart = 0
F6Zoom.HorStop = 0
F6Zoom.VariableVerZoom = False
F6Zoom.VariableHorZoom = False Set F7 = Math.F7
' F7 ...
F7.View = False
F7.UseGrid = "YT1"
F7.UseDotJoin = True
F7.Persisted = False
F7.PersistenceSaturation = 50
F7.PersistenceMonoChrome = False
F7.EZoff = False
F7.EZFunction1 = "widen1"
F7.Function2 = "undef"
F7.EZSource1 = "C1"

Set F7Operator1 = F7.Operator1
' Operator1 ...
F7Operator1.Enable = True
```

```
F7Operator1.Origin = ""
F7Operator1.Visible = True
F7Operator1.XPos = 0
F7Operator1.YPos = 0
F7Operator1.UsageCount = 0

Set F7Operator2 = F7.Operator2
' Operator2 ...

Set F7Zoom = F7.Zoom
' Zoom ...
F7Zoom.Enable = True
F7Zoom.Origin = ""
F7Zoom.Visible = True
F7Zoom.XPos = 0
F7Zoom.YPos = 0
F7Zoom.UsageCount = 0
F7Zoom.VerPos = 0.5
F7Zoom.VerZoom = 1
F7Zoom.HorPos = 0.5
F7Zoom.HorZoom = 1
F7Zoom.MinVisiblePoints = 5
F7Zoom.VerStart = 0
F7Zoom.VerStop = 0
F7Zoom.HorStart = 0
F7Zoom.HorStop = 0
F7Zoom.VariableVerZoom = False
F7Zoom.VariableHorZoom = False Set F8 = Math.F8
' F8 ...
F8.View = False
F8.UseGrid = "YT1"
F8.UseDotJoin = True
F8.Persisted = False
F8.PersistenceSaturation = 50
F8.PersistenceMonoChrome = False
F8.EZoff = False
F8.EZFunction1 = "widerit"
F8.Function2 = "undef"
F8.EZSource1 = "C1"

Set F8Operator1 = F8.Operator1
' Operator1 ...
F8Operator1.Enable = True
F8Operator1.Origin = ""
F8Operator1.Visible = True
F8Operator1.XPos = 0
F8Operator1.YPos = 0
F8Operator1.UsageCount = 0

Set F8Operator2 = F8.Operator2
' Operator2 ...

Set F8Zoom = F8.Zoom
' Zoom ...
F8Zoom.Enable = True
```

PATENT
455610-2500

```
F8Zoom.Origin = ""
F8Zoom.Visible = True
F8Zoom.XPos = 0
F8Zoom.YPos = 0
F8Zoom.UsageCount = 0
F8Zoom.VerPos = 0.5
F8Zoom.VerZoom = 1
F8Zoom.HorPos = 0.5
F8Zoom.HorZoom = 1
F8Zoom.MinVisiblePoints = 5
F8Zoom.VerStart = 0
F8Zoom.VerStop = 0
F8Zoom.HorStart = 0
F8Zoom.HorStop = 0
F8Zoom.VariableVerZoom = False
F8Zoom.VariableHorZoom = False Set Measure = WaveMaster.Measure
' Measure ...
Measure.StdSource = "C1"
Measure.MeasureMode = "Off"
Measure.calculate0 = False
Measure.calculate1 = False
Measure.calculate2 = False
Measure.ViewP1 = True
Measure.ViewP2 = True
Measure.ViewP3 = True
Measure.ViewP4 = True
Measure.ViewP5 = True
Measure.ViewP6 = True
Measure.ViewP7 = True
Measure.ViewP8 = True
Measure.ViewP9 = True
Measure.ViewP10 = True
Measure.ViewP11 = True
Measure.ViewP12 = True
Measure.ViewP13 = True
Measure.ViewP14 = True
Measure.ViewP15 = True
Measure.ViewP16 = True
Measure.ViewP17 = True
Measure.ViewP18 = True
Measure.ViewP19 = True
Measure.ViewP20 = True
Measure.ViewP21 = True
Measure.ViewP22 = True
Measure.ViewP23 = True
Measure.ViewP24 = True Set P1 = Measure.P1
' P1 ...
P1.View = True
P1.Present = False
P1.Used = False
P1.CurrentNew = 0
P1.Source1 = "C1"
```

00037619

```
Set P1Operator = P1.Operator
' Operator ...
P1Operator.Enable = True
P1Operator.Origin = ""
P1Operator.Visible = True
P1Operator.XPos = 0
P1Operator.YPos = 0
P1Operator.UsageCount = 0

Set P2 = Measure.P2
' P2 ...
P2.View = True
P2.Present = False
P2.Used = False
P2.CurrentNew = 0
P2.Source1 = "C1"

Set P2Operator = P2.Operator
' Operator ...
P2Operator.Enable = True
P2Operator.Origin = ""
P2Operator.Visible = True
P2Operator.XPos = 0
P2Operator.YPos = 0
P2Operator.UsageCount = 0

Set P3 = Measure.P3
' P3 ...
P3.View = True
P3.Present = False
P3.Used = False
P3.CurrentNew = 0
P3.Source1 = "C1"

Set P3Operator = P3.Operator
' Operator ...
P3Operator.Enable = True
P3Operator.Origin = ""
P3Operator.Visible = True
P3Operator.XPos = 0
P3Operator.YPos = 0
P3Operator.UsageCount = 0

Set P4 = Measure.P4
' P4 ...
P4.View = True
P4.Present = False
P4.Used = False
P4.CurrentNew = 0
P4.Source1 = "C1"

Set P4Operator = P4.Operator
' Operator ...
P4Operator.Enable = True
P4Operator.Origin = ""
P4Operator.Visible = True
P4Operator.XPos = 0
```

PATENT
455610-2500

```
P4Operator.YPos = 0
P4Operator.UsageCount = 0

Set P5 = Measure.P5
' P5 ...
P5.View = True
P5.Present = False
P5.Used = False
P5.CurrentNew = 0
P5.Source1 = "C1"

Set P5Operator = P5.Operator
' Operator ...
P5Operator.Enable = True
P5Operator.Origin = ""
P5Operator.Visible = True
P5Operator.XPos = 0
P5Operator.YPos = 0
P5Operator.UsageCount = 0
P5Operator.LevelsAre = "Percent"
P5Operator.LowPct = 10
P5Operator.HighPct = 90
P5Operator.LowAbs = 0
P5Operator.HighAbs = 0

Set P6 = Measure.P6
' P6 ...
P6.View = True
P6.Present = False
P6.Used = False
P6.CurrentNew = 0
P6.Source1 = "C1"

Set P6Operator = P6.Operator
' Operator ...
P6Operator.Enable = True
P6Operator.Origin = ""
P6Operator.Visible = True
P6Operator.XPos = 0
P6Operator.YPos = 0
P6Operator.UsageCount = 0
P6Operator.LevelsAre = "Percent"
P6Operator.LowPct = 10
P6Operator.HighPct = 90
P6Operator.LowAbs = 0
P6Operator.HighAbs = 0

Set P7 = Measure.P7
' P7 ...
P7.View = True
P7.Present = False
P7.Used = False
P7.CurrentNew = 0
P7.Source1 = "C1"

Set P7Operator = P7.Operator
' Operator ...
```

00037619

PATENT
455610-2500

```
P7Operator.Enable = True
P7Operator.Origin = ""
P7Operator.Visible = True
P7Operator.XPos = 0
P7Operator.YPos = 0
P7Operator.UsageCount = 0
P7Operator.Cyclic = False
P7Operator.CursorDisplay = "Simple"

Set P8 = Measure.P8
' P8 ...
P8.View = True
P8.Present = False
P8.Used = False
P8.CurrentNew = 0
P8.Source1 = "C1"

Set P8Operator = P8.Operator
' Operator ...
P8Operator.Enable = True
P8Operator.Origin = ""
P8Operator.Visible = True
P8Operator.XPos = 0
P8Operator.YPos = 0
P8Operator.UsageCount = 0

Set Memory = WaveMaster.Memory
' Memory ...
Memory.ViewM1 = False
Memory.ViewM2 = False
Memory.ViewM3 = False
Memory.ViewM4 = False
Memory.AutoScrollOn = False
Memory.MultiZoomOn = False Set M1 = Memory.M1
' M1 ...
M1.View = False
M1.UseGrid = "YT1"
M1.UseDotJoin = True
M1.Persisted = False
M1.PersistenceSaturation = 50
M1.PersistenceMonoChrome = False
M1.Source1 = "C1"

Set M1Memory = M1.Memory
' Memory ...
M1Memory.Enable = True
M1Memory.Origin = ""
M1Memory.Visible = True
M1Memory.XPos = 0
M1Memory.YPos = 0
M1Memory.UsageCount = 0

Set M1Zoom = M1.Zoom
' Zoom ...
M1Zoom.Enable = True
```

00037619

35

```
M1Zoom.Origin = ""
M1Zoom.Visible = True
M1Zoom.XPos = 0
M1Zoom.YPos = 0
M1Zoom.UsageCount = 0
M1Zoom.VerPos = 0.5
M1Zoom.VerZoom = 1
M1Zoom.HorPos = 0.5
M1Zoom.HorZoom = 1
M1Zoom.MinVisiblePoints = 5
M1Zoom.VerStart = 0
M1Zoom.VerStop = 0
M1Zoom.HorStart = 0
M1Zoom.HorStop = 0
M1Zoom.VariableVerZoom = False
M1Zoom.VariableHorZoom = False Set M2 = Memory.M2
' M2 ...
M2.View = False
M2.UseGrid = "YT1"
M2.UseDotJoin = True
M2.Persisted = False
M2.PersistenceSaturation = 50
M2.PersistenceMonoChrome = False
M2.Source1 = "C1"

Set M2Memory = M2.Memory
' Memory ...
M2Memory.Enable = True
M2Memory.Origin = ""
M2Memory.Visible = True
M2Memory.XPos = 0
M2Memory.YPos = 0
M2Memory.UsageCount = 0

Set M2Zoom = M2.Zoom
' Zoom ...
M2Zoom.Enable = True
M2Zoom.Origin = ""
M2Zoom.Visible = True
M2Zoom.XPos = 0
M2Zoom.YPos = 0
M2Zoom.UsageCount = 0
M2Zoom.VerPos = 0.5
M2Zoom.VerZoom = 1
M2Zoom.HorPos = 0.5
M2Zoom.HorZoom = 1
M2Zoom.MinVisiblePoints = 5
M2Zoom.VerStart = 0
M2Zoom.VerStop = 0
M2Zoom.HorStart = 0
M2Zoom.HorStop = 0
M2Zoom.VariableVerZoom = False
M2Zoom.VariableHorZoom = False Set M3 = Memory.M3
```

PATENT
455610-2500

```
' M3 ...
M3.View = False
M3.UseGrid = "YT1"
M3.UseDotJoin = True
M3.Persisted = False
M3.PersistenceSaturation = 50
M3.PersistenceMonoChrome = False
M3.Source1 = "C1"

Set M3Memory = M3.Memory
' Memory ...
M3Memory.Enable = True
M3Memory.Origin = ""
M3Memory.Visible = True
M3Memory.XPos = 0
M3Memory.YPos = 0
M3Memory.UsageCount = 0

Set M3Zoom = M3.Zoom
' Zoom ...
M3Zoom.Enable = True
M3Zoom.Origin = ""
M3Zoom.Visible = True
M3Zoom.XPos = 0
M3Zoom.YPos = 0
M3Zoom.UsageCount = 0
M3Zoom.VerPos = 0.5
M3Zoom.VerZoom = 1
M3Zoom.HorPos = 0.5
M3Zoom.HorZoom = 1
M3Zoom.MinVisiblePoints = 5
M3Zoom.VerStart = 0
M3Zoom.VerStop = 0
M3Zoom.HorStart = 0
M3Zoom.HorStop = 0
M3Zoom.VariableVerZoom = False
M3Zoom.VariableHorZoom = False Set M4 = Memory.M4
' M4 ...
M4.View = False
M4.UseGrid = "YT1"
M4.UseDotJoin = True
M4.Persisted = False
M4.PersistenceSaturation = 50
M4.PersistenceMonoChrome = False
M4.Source1 = "C1"

Set M4Memory = M4.Memory
' Memory ...
M4Memory.Enable = True
M4Memory.Origin = ""
M4Memory.Visible = True
M4Memory.XPos = 0
M4Memory.YPos = 0
M4Memory.UsageCount = 0
```

00037619

```
Set M4Zoom = M4.Zoom
' Zoom ...
M4Zoom.Enable = True
M4Zoom.Origin = ""
M4Zoom.Visible = True
M4Zoom.XPos = 0
M4Zoom.YPos = 0
M4Zoom.UsageCount = 0
M4Zoom.VerPos = 0.5
M4Zoom.VerZoom = 1
M4Zoom.HorPos = 0.5
M4Zoom.HorZoom = 1
M4Zoom.MinVisiblePoints = 5
M4Zoom.VerStart = 0
M4Zoom.VerStop = 0
M4Zoom.HorStart = 0
M4Zoom.HorStop = 0
M4Zoom.VariableVerZoom = False
M4Zoom.VariableHorZoom = False Set Cursors = WaveMaster.Cursors
' Cursors ...
Cursors.View = False
Cursors.Mode = "RelHor"
Cursors.Readout = "AbsValues"
Cursors.Pos1 = 0.000000125
Cursors.Pos2 = 0.000000275
Cursors.Track = False
Cursors.DisplayedDimension = "all"
Cursors.XPos1 = 0.000000125
Cursors.XPos2 = 0.000000275
Cursors.YPos1 = -1
Cursors.YPos2 = 1
Cursors.XPos1Nb1 = 0
Cursors.XPos2Nb1 = 0
Cursors.YPos1Nb1 = 0
Cursors.YPos2Nb1 = 0
Cursors.XMinNb1 = 0
Cursors.XMaxNb1 = 0
Cursors.ExecutiveViewC1 = False
Cursors.ExecutiveGridC1 = "<no grid>"
Cursors.XPos1Nb2 = 0
Cursors.XPos2Nb2 = 0
Cursors.YPos1Nb2 = 0
Cursors.YPos2Nb2 = 0
Cursors.XMinNb2 = 0
Cursors.XMaxNb2 = 0
Cursors.ExecutiveViewC2 = False
Cursors.ExecutiveGridC2 = "<no grid>"
Cursors.XPos1Nb3 = 0
Cursors.XPos2Nb3 = 0
Cursors.YPos1Nb3 = 0
Cursors.YPos2Nb3 = 0
Cursors.XMinNb3 = 0
Cursors.XMaxNb3 = 0
Cursors.ExecutiveViewC3 = False
Cursors.ExecutiveGridC3 = "<no grid>"
```

```
        Cursors.XPos1Nb4 = 0
        Cursors.XPos2Nb4 = 0
        Cursors.YPos1Nb4 = 0
        Cursors.YPos2Nb4 = 0
        Cursors.XMinNb4 = 0
        Cursors.XMaxNb4 = 0
        Cursors.ExecutiveViewC4 = False
        Cursors.ExecutiveGridC4 = "<no grid>"
        Cursors.XPos1Nb5 = 0
        Cursors.XPos2Nb5 = 0
        Cursors.YPos1Nb5 = 0
        Cursors.YPos2Nb5 = 0
        Cursors.XMinNb5 = 0
        Cursors.XMaxNb5 = 0
        Cursors.ExecutiveViewF1 = False
        Cursors.ExecutiveGridF1 = "<no grid>"
        Cursors.XPos1Nb6 = 0
        Cursors.XPos2Nb6 = 0
        Cursors.YPos1Nb6 = 0
        Cursors.YPos2Nb6 = 0
        Cursors.XMinNb6 = 0
        Cursors.XMaxNb6 = 0
        Cursors.ExecutiveViewF2 = False
        Cursors.ExecutiveGridF2 = "<no grid>"
        Cursors.XPos1Nb7 = 0
        Cursors.XPos2Nb7 = 0
        Cursors.YPos1Nb7 = 0
        Cursors.YPos2Nb7 = 0
        Cursors.XMinNb7 = 0
        Cursors.XMaxNb7 = 0
        Cursors.ExecutiveViewF3 = False
        Cursors.ExecutiveGridF3 = "<no grid>"
        Cursors.XPos1Nb8 = 0
        Cursors.XPos2Nb8 = 0
        Cursors.YPos1Nb8 = 0
        Cursors.YPos2Nb8 = 0
        Cursors.XMinNb8 = 0
        Cursors.XMaxNb8 = 0
        Cursors.ExecutiveViewF4 = False
        Cursors.ExecutiveGridF4 = "<no grid>"

Set Display = WaveMaster.Display
        ' Display ...
        Display.UseGrid = "Single"
        Display.TraceStyle = "Line"
        Display.GridIntensity = 40
        Display.ScreenSaveEnable = True
        Display.ScreenSaveTimeout = 60
        Display.PersistenceEnable = "Off"
        Display.Persisted = False
        Display.PersistenceSaturation = 50
        Display.PersistenceStyle = "Color"
        Display.PersistenceMonoChrome = False
        Display.PersistenceApplyToAll = True
        Display.PersistenceSelectedTrace = "C1"

Set Help = WaveMaster.Help
```

```
' Help ...

Set SaveRecall = WaveMaster.SaveRecall
' SaveRecall ...
SaveRecall.SaveSource = "C1"
SaveRecall.SaveDestination = "M2"
SaveRecall.RecallSource = "M1"
SaveRecall.RecallDestination = "M1"
SaveRecall.DiskFunction = "Delete"

Set SaveRecallRemote = SaveRecall.Remote
' Remote ...
SaveRecallRemote.ImportDestination = "M1"
SaveRecallRemote.ExportSource = "C1"
SaveRecallRemote.ExportBlock = "ALL"
SaveRecallRemote.ExportSparsing = 0
SaveRecallRemote.ExportNumberOfPoints = 0
SaveRecallRemote.ExportFirstPoint = 0
SaveRecallRemote.ExportSegmentNumber = 0
SaveRecallRemote.ExportCommOrder = "HI"
SaveRecallRemote.ExportBlockFormat = "DEF9"
SaveRecallRemote.ExportDataType = "BYTE"
SaveRecallRemote.ExportEncoding = "BIN"

Set Utility = WaveMaster.Utility
' Utility ...
Utility.Details = False

Set UtilityService = Utility.Service
' Service ...

Set HardCopy = WaveMaster.HardCopy
' HardCopy ...

WaveMaster.Enable = true
```

Figure 10:
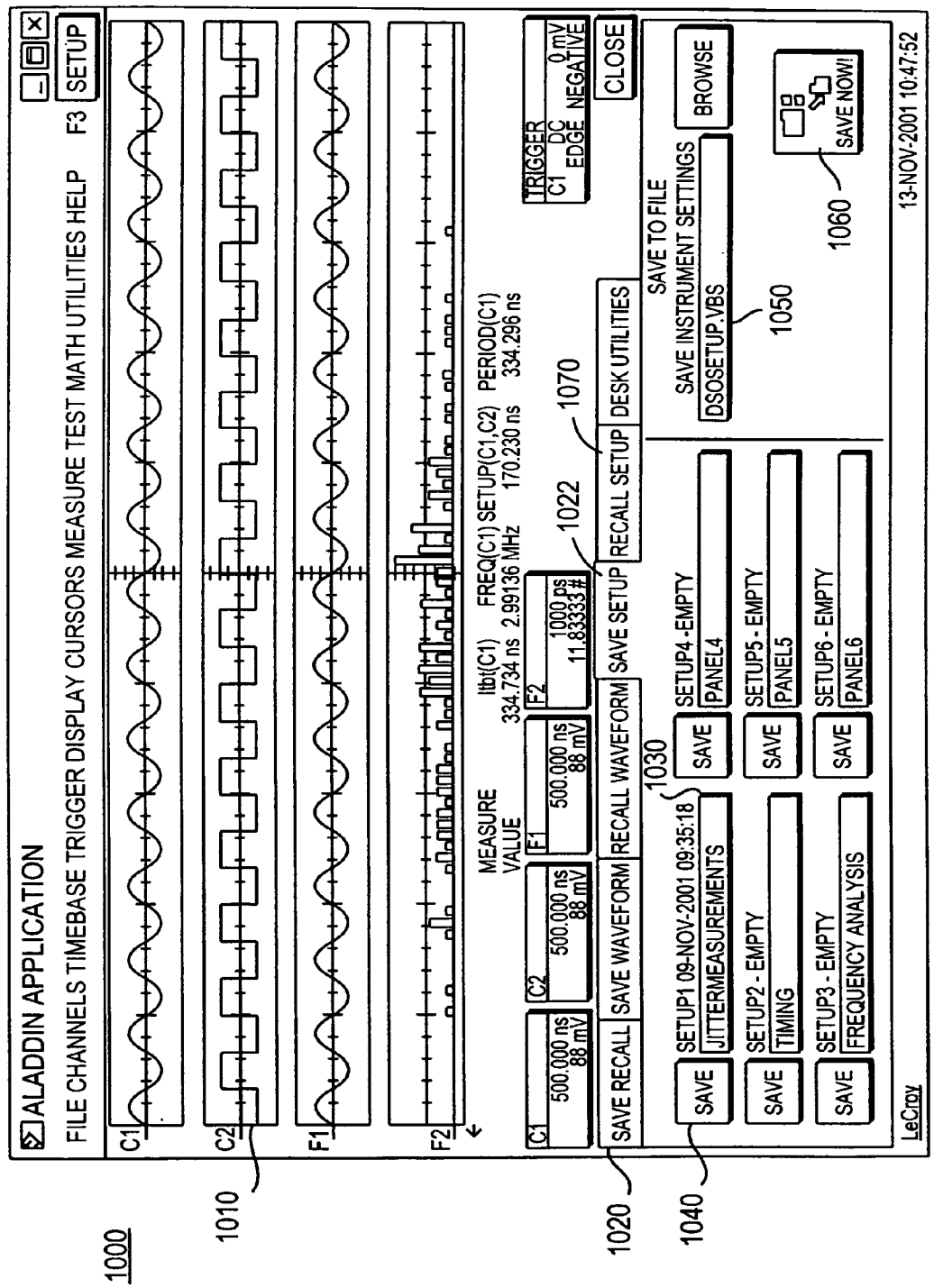
FIG. 10 depicts the screen for using the invention.

FIG. 10 shows the screen for using the invention. A display screen 1000 is shown. The display screen may be controlled by any modem operating system, such as Microsoft Windows. Display shows waveforms 1010. At the bottom of the display 1000, there are tabs 1020 allowing the user to save/recall, save waveform, recall waveform, save setup, recall setup and disk utilities. Here the Save Setup tab 1022 has been chosen. A setup may be saved by typing a name in internal box 1030 and pressing save button 1040. The Instrument Settings may be saved by typing a visual basic file name in Instrument Setting box 1050 and pressing the save now button 1060. The setups and instrument settings may be recalled in a similar way by choosing the Recall Setup tab 1070.

Figure 11:
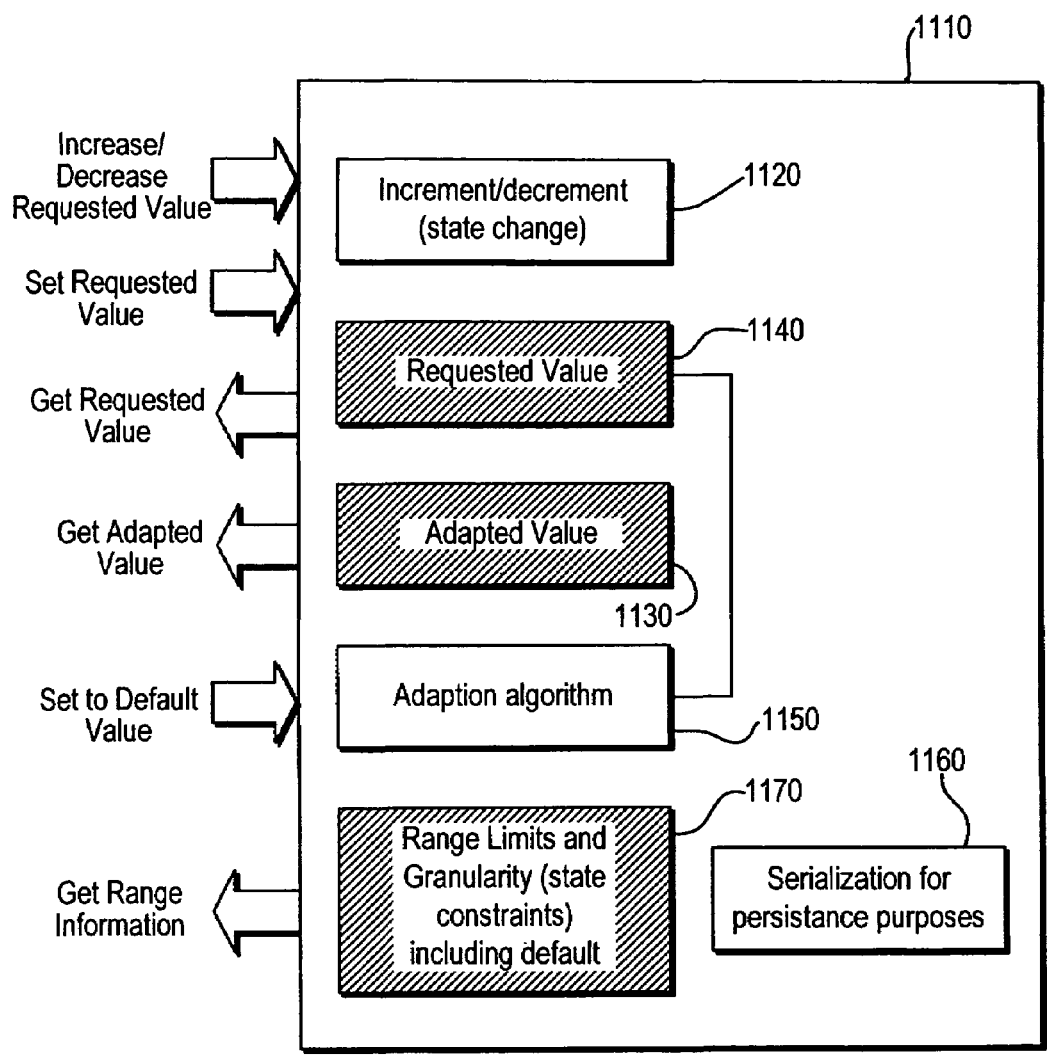
FIG. 11 shows a graphic representation of a Cvar.

FIG. 11 shows a graphic representation of a Cvar. The Cvar 1110 is shown. The Cvar 1110 contains increment/decrement 1120 or state change. The incrementing/decrementing algorithm that makes sure that the Requested and therefore the adapted value stay within the limits of the Rang. The Cvar also contains memory for Requested value 1140, adapted value 1130 and range limits and granularity 1170. The Adaption algorithm 1150 uses the range limits and granularity 1170 and the requested value 1140 to figure the adapted value 1130. The Adaptation algorithm that makes sure that a Requested value is memorized, and that the resulting Adapted value stays within the limits of the Range. The requested value 1140 can change the requested value 1140. The Cvar also contains Serialization 1160 for persistence purposes. The Serialization algorithm or process, which is responsible for saving the Cvar value to a Panel file and restoring it from the Panel file. The Cvar 1110 has inputs and outputs. FIG. 11 also shows the most important interactions between the Cvar 1110 and it's environment (other software objects discussed elsewhere—the Bag, the Widgets and the Engine). The inputs or commands from Manipulators that may request to increment/decrement the requested value 1172 (with respect to the current adapted value), to set the requested value to a stated new value 1174, and to set the Cvar's requested value to the (internallly known) default value 1176. The outputs or queries coming from Event Sinks that seek to obtain the Requested value 1182, the Adapted value 1184, and the Range information 1178. This is not shown in detail, this may be obtained in the form of text string from any type of Cvar, and in numeric or text string form appropriate for each particular Cvar type.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A system for defining internal variables embedded in an instrument that govern an operation of the instrument, comprising:

means for defining a range of values of a first variable corresponding to one or more physical restraints of a corresponding physical structure of the instrument;

means for selecting a value for the first variable;

means for confirming the selected value for the first variable is within the defined range of values;

means for storing the value of the first variable;

means for changing the value of the first variable;

means for confirming the changed value of the first variable is within the defined range of values of the first variable;

means for designating a second variable that is to be evaluated in accordance with a change in the first variable;

means for modifying a predetermined second variable in accordance with the changing of the value of the first variable; and means for confirming that the changed value of the second variable is within an allowed range of values of the second variable corresponding to one or more physical constraints of a corresponding physical structure of the instrument.

2. The system of claim 1, wherein the first and second variables are part of a group of variables having the same value ranges.

3. The system of claim 2, wherein a change in the range of variables for the group of variables results in a change in the range of the corresponding values for the first and second variables in the group.

4. A system for defining internal variables embedded in an instrument that govern an operation or the instrument, comprising:

means for defining a range of values of a variable corresponding to one or more physical restraints of a corresponding physical structure of the instrument;

means for selecting a value for the variable;

means for confirming the selected value for the variable is within the defined range of values; and means for storing the value of the variable when said value is confirmed to be within said defined range.

5. The system of claim 4, wherein the variable is part of a group of variables having the same value ranges; and wherein a change in the range of values for the group of variables results in a change in the range of the value for the variable.

6. The system of claim 4, further comprising means for transferring the value of the variable to a second system.

7. The system of claim 6, wherein the second system defines a range of values for the transferred variable that is different than the range of values of the variable defined by the first system.

8. A method for defining internal variables embedded in an instrument that govern an operation of the instrument, comprising the steps or:

defining a range of values of a first variable corresponding to one or more physical restraints of a corresponding physical structure or the instrument;

selecting a value for the first variable;

confirming the selected value for the first variable is within the defined range of values;

storing the value of the first variable;

changing the value of the first variable;

confirming the changed value of the first variable is within the defined range of values of the first variable;

designating a second variable that is to be evaluated in accordance with a change in the first variable;

modifying a predetermined second variable in accordance with the changing of the value of the first variable; and confirming that the changed value of the second variable is within an allowed range of values of the second variable corresponding to one or more physical constraints of a corresponding physical structure of the instrument.

9. The method of claim 8, wherein the first and second variables are part of a group of variables having the same value ranges.

10. The method of claim 9, wherein a change in the range of variables for the group of variables results in a change in the range of the corresponding values for the first and second variables in the group.

11. A method for defining internal variables embedded in an instrument that govern an operation of the instrument, comprising the steps of:
   defining a range of values of a variable corresponding to one or more physical restraints of a corresponding physical structure of the instrument;
   selecting a value for the variable;
   confirming the selected value for the variable is within the defined range of values; and
   storing the value of the variable when said value is confirmed to be within said defined range.

12. The method of claim 11, wherein the variable is part of a group of variables having the same value ranges; and
   wherein a change in the range of values for the group of variables results in a change in the range of the value for the variable.

13. The method of claim 11, further comprising the step of transferring the value of the variable to a second system.

14. The method of claim 13, wherein the second system defines a range of values for the transferred variable that is different than the range of values of the variable defined by the first system.

15. An internal variable embedded in an instrument that governs a portion of an operation of the instrument, comprising:
   a predetermined range of values for the variable corresponding to one or more physical restraints of a corresponding physical structure of the instrument; and
   a value stored for the variable, the value corresponding to an operating parameter of the corresponding physical structure of the instrument;
   wherein if the value for the variable is determined to be outside of the predetermined range, the variable is not set to the stored value.

16. The internal variable of claim 15, wherein a change in the value of the variable indicates that a change in another variable is required.

17. The internal variable of claim 15, wherein when the value for the variable is determined to be outside of the predetermined range, another value is requested for the variable.

18. The internal variable of claim 15, wherein the predetermined range of values comprises an optimum operating range for the corresponding physical structure of the instrument.

* * * * *

UNITED STATES PATENT AND TRADEMARK OFFICE
CERTIFICATE OF CORRECTION

| | |
|---|---|
| PATENT NO. | : 7,058,800 B2 |
| APPLICATION NO. | : 09/988418 |
| DATED | : June 6, 2006 |
| INVENTOR(S) | : Rudolf Farkas |

It is certified that error appears in the above-identified patent and that said Letters Patent is hereby corrected as shown below:

TITLE PAGE,
IN THE TITLE (54):

Please change " VALVE" to --VALUE-- so that the title reads: "SYSTEM FOR DEFINING INTERNAL VARIABLES BY SELECTING AND CONFIRMING THE SELECTED VALUE IS WITHIN A DEFINED RANGE OF VALUES"

Col. 50, line 28 (Claim 4)    change "or" to --of--.

Col. 51, line 5 (Claim 8)    change "con firming" to --confirming--.

Signed and Sealed this

Eighth Day of August, 2006

JON W. DUDAS
*Director of the United States Patent and Trademark Office*